United States Patent
Cheah et al.

(10) Patent No.: US 10,633,898 B2
(45) Date of Patent: Apr. 28, 2020

(54) MICRO-HINGE FOR AN ELECTRONIC DEVICE

(71) Applicant: Intel Corporation, Santa Clara, CA (US)

(72) Inventors: Bok Eng Cheah, Bayan Lepas (MY); Howe Yin Loo, Sungai Petani (MY); Min Suet Lim, Bayan Lepas (MY); Jackson Chung Peng Kong, Tanjung Tokong (MY); Poh Tat Oh, Bayan Lepas (MY)

(73) Assignee: Intel Corporation, Santa Clara, CA (US)

( * ) Notice: Subject to any disclaimer, the term of this patent is extended or adjusted under 35 U.S.C. 154(b) by 22 days.

(21) Appl. No.: 16/012,469

(22) Filed: Jun. 19, 2018

(65) Prior Publication Data
US 2019/0093402 A1 Mar. 28, 2019

Related U.S. Application Data

(63) Continuation of application No. 14/996,568, filed on Jan. 15, 2016, now Pat. No. 10,036,187, which is a (Continued)

(51) Int. Cl.
*E05D 3/06* (2006.01)
*G06F 1/16* (2006.01)
(Continued)

(52) U.S. Cl.
CPC ............ *E05D 3/06* (2013.01); *E05D 11/0081* (2013.01); *G06F 1/1615* (2013.01);
(Continued)

(58) Field of Classification Search
CPC ..... E05D 3/06; E05D 11/0081; Y10T 16/522; Y10T 16/533; Y10T 16/5475
(Continued)

(56) References Cited

U.S. PATENT DOCUMENTS 1,984,092 A 12/1934 Soss
2,013,915 A 9/1935 Hughes
(Continued)

FOREIGN PATENT DOCUMENTS

CN 101451573 6/2009
CN 102298421 12/2011
(Continued)

OTHER PUBLICATIONS

Japanese Patent Office, "Notification of Reasons for Refusal," issued in connection with Japanese Patent Application No. 2016-553368, dated Jul. 28, 2017, 5 pages (includes English translation).
(Continued)

*Primary Examiner* — Roberta S Delisle
(74) *Attorney, Agent, or Firm* — Hanley, Flight & Zimmerman, LLC

(57) ABSTRACT

Particular embodiments described herein provide for an electronic device, such as a notebook computer or laptop, which includes a circuit board coupled to a plurality of electronic components (which includes any type of components, elements, circuitry, etc.). One particular example implementation of the electronic device may include a low profile hinge design that includes a micro-hinge. The micro-hinge can couple a first element to a second element and can include a first attachment that couples to the first element, a second attachment that couples to the second element, and a plurality of linkages that couples the first attachment to the second attachment. The low profile hinge can further include a plurality of micro-hinges and a plurality of support rods.

20 Claims, 23 Drawing Sheets

Related U.S. Application Data continuation of application No. 14/229,835, filed on Mar. 29, 2014, now abandoned.

(51) Int. Cl.
*G06F 1/3218* (2019.01)
*G06F 1/3234* (2019.01)
*E05D 11/00* (2006.01)
*H05K 5/02* (2006.01)

(52) U.S. Cl.
CPC .......... *G06F 1/1616* (2013.01); *G06F 1/1618* (2013.01); *G06F 1/1662* (2013.01); *G06F 1/1677* (2013.01); *G06F 1/1681* (2013.01); *G06F 1/3218* (2013.01); *G06F 1/3265* (2013.01); *H05K 5/0226* (2013.01); *Y02D 10/153* (2018.01); *Y10T 16/522* (2015.01); *Y10T 16/533* (2015.01); *Y10T 16/5475* (2015.01)

(58) Field of Classification Search
USPC .......................................... 16/366, 368, 369
See application file for complete search history.

(56) References Cited

U.S. PATENT DOCUMENTS

| | | | |
|---|---|---|---|
| 2,200,142 A | 5/1940 | Witschi | |
| 2,721,353 A | 10/1955 | Mackintosh | |
| 4,858,488 A | 8/1989 | Butts | |
| 6,223,393 B1 | 5/2001 | Knopf | |
| 6,276,026 B1 | 8/2001 | Wille | |
| 6,527,036 B1 | 3/2003 | Welsh | |
| 7,155,266 B2 | 12/2006 | Stefansen | |
| 7,345,872 B2 | 3/2008 | Wang | |
| 7,377,012 B2 | 5/2008 | Lu | |
| 7,500,288 B2 | 3/2009 | Chung et al. | |
| 7,532,916 B2 | 5/2009 | Lee et al. | |
| 7,656,661 B2 | 2/2010 | Shaum | |
| 7,805,810 B2 | 10/2010 | Hoffman | |
| 7,821,783 B2 | 10/2010 | Wang et al. | |
| 8,060,985 B2 | 11/2011 | Lin | |
| 8,125,759 B2 | 2/2012 | Fukuma et al. | |
| 8,208,245 B2 | 6/2012 | Staats et al. | |
| 8,289,685 B2 | 10/2012 | Li et al. | |
| 8,320,123 B2 | 11/2012 | Chen | |
| 8,424,160 B2 | 4/2013 | Chen | |
| 8,498,100 B1 | 7/2013 | Whitt, III et al. | |
| 8,543,227 B1 | 9/2013 | Perek et al. | |
| 8,548,608 B2 | 10/2013 | Perek et al. | |
| 8,564,944 B2 | 10/2013 | Whitt, III et al. | |
| 8,570,725 B2 | 10/2013 | Whitt, III et al. | |
| 8,610,015 B2 | 12/2013 | Whitt, III et al. | |
| 8,614,666 B2 | 12/2013 | Whitman et al. | |
| 8,646,999 B2 | 2/2014 | Shaw et al. | |
| 8,699,215 B2 | 4/2014 | Whitt, III et al. | |
| 8,713,759 B2 | 5/2014 | Cai | |
| 8,720,011 B1 | 5/2014 | Hsu et al. | |
| 8,724,302 B2 | 5/2014 | Whitt, III et al. | |
| 8,780,540 B2 | 7/2014 | Whitt, III et al. | |
| 8,780,541 B2 | 7/2014 | Whitt, III et al. | |
| 8,787,016 B2 | 7/2014 | Rothkopf et al. | |
| 8,791,382 B2 | 7/2014 | Whitt, III et al. | |
| 8,813,312 B2 | 8/2014 | Song et al. | |
| 8,830,668 B2 | 9/2014 | Whit, III et al. | |
| 8,854,799 B2 | 10/2014 | Whitt, III et al. | |
| 8,896,993 B2 | 11/2014 | Belesiu et al. | |
| 8,903,517 B2 | 12/2014 | Perek et al. | |
| 8,906,440 B2 | 12/2014 | Otto | |
| 8,947,861 B2 | 2/2015 | Staats et al. | |
| 8,947,864 B2 | 2/2015 | Whitt, III et al. | |
| 9,047,055 B2 | 6/2015 | Song | |
| 9,360,896 B2 | 6/2016 | Lim et al. | |
| 10,036,187 B2 | 7/2018 | Cheah et al. | |
| 10,041,282 B2 | 8/2018 | Cheah et al. | |
| 10,067,530 B2 * | 9/2018 | Tazbaz | G06F 1/1637 |
| 2004/0139579 A1 | 7/2004 | Su | |
| 2004/0212968 A1 | 10/2004 | Lin | |
| 2007/0079477 A1 | 4/2007 | Huang | |
| 2007/0117600 A1 | 5/2007 | Robertson, Jr. et al. | |
| 2009/0147458 A1 | 6/2009 | Wang et al. | |
| 2009/0244009 A1 | 10/2009 | Staats et al. | |
| 2009/0310298 A1 | 12/2009 | Chou et al. | |
| 2010/0018020 A1 | 1/2010 | Huang | |
| 2010/0024171 A1 | 2/2010 | Wang | |
| 2010/0226089 A1 | 9/2010 | Wang et al. | |
| 2010/0232100 A1 | 9/2010 | Fukuma et al. | |
| 2011/0261515 A1 | 10/2011 | Li et al. | |
| 2011/0265288 A1 | 11/2011 | Chiang | |
| 2012/0147542 A1 | 6/2012 | Kim | |
| 2012/0236485 A1 | 9/2012 | Staats et al. | |
| 2012/0321748 A1 | 12/2012 | Otto et al. | |
| 2012/0321769 A1 | 12/2012 | Otto | |
| 2013/0010405 A1 | 1/2013 | Rothkopf et al. | |
| 2013/0083466 A1 | 4/2013 | Becze et al. | |
| 2013/0216740 A1 | 8/2013 | Russell-Clarke et al. | |
| 2013/0219663 A1 | 8/2013 | Cai | |
| 2013/0228023 A1 | 9/2013 | Drasnin et al. | |
| 2013/0228433 A1 | 9/2013 | Shaw et al. | |
| 2013/0228434 A1 | 9/2013 | Whitt, III et al. | |
| 2013/0228439 A1 | 9/2013 | Whitt, III et al. | |
| 2013/0229100 A1 | 9/2013 | Siddiqui et al. | |
| 2013/0229335 A1 | 9/2013 | Whitman et al. | |
| 2013/0229347 A1 | 9/2013 | Lutz, III et al. | |
| 2013/0229350 A1 | 9/2013 | Shaw et al. | |
| 2013/0229351 A1 | 9/2013 | Whitt, III et al. | |
| 2013/0229354 A1 | 9/2013 | Whitt, III et al. | |
| 2013/0229363 A1 | 9/2013 | Whitman et al. | |
| 2013/0229380 A1 | 9/2013 | Lutz, III et al. | |
| 2013/0229534 A1 | 9/2013 | Panay et al. | |
| 2013/0229568 A1 | 9/2013 | Belesiu et al. | |
| 2013/0229756 A1 | 9/2013 | Whitt, III et al. | |
| 2013/0229757 A1 | 9/2013 | Whitt, III et al. | |
| 2013/0229758 A1 | 9/2013 | Belesiu et al. | |
| 2013/0229759 A1 | 9/2013 | Whitt, III et al. | |
| 2013/0229760 A1 | 9/2013 | Whitt, III et al. | |
| 2013/0229761 A1 | 9/2013 | Shaw et al. | |
| 2013/0229762 A1 | 9/2013 | Whitt, III et al. | |
| 2013/0229773 A1 | 9/2013 | Siddiqui et al. | |
| 2013/0230346 A1 | 9/2013 | Shaw et al. | |
| 2013/0231755 A1 | 9/2013 | Perek et al. | |
| 2013/0232280 A1 | 9/2013 | Perek et al. | |
| 2013/0232353 A1 | 9/2013 | Belesiu et al. | |
| 2013/0301199 A1 | 11/2013 | Whitt, III et al. | |
| 2013/0301206 A1 | 11/2013 | Whitt, III et al. | |
| 2013/0322000 A1 | 12/2013 | Whitt, III et al. | |
| 2013/0322001 A1 | 12/2013 | Whitt, III et al. | |
| 2014/0012401 A1 | 1/2014 | Perek et al. | |
| 2014/0043275 A1 | 2/2014 | Whitman et al. | |
| 2014/0048399 A1 | 2/2014 | Whitt, III et al. | |
| 2014/0119802 A1 | 5/2014 | Shaw et al. | |
| 2014/0174227 A1 | 6/2014 | Hsu et al. | |
| 2014/0204514 A1 | 7/2014 | Whitt, III et al. | |
| 2014/0204515 A1 | 7/2014 | Whitt, III et al. | |
| 2014/0247546 A1 | 9/2014 | Whitt, III et al. | |
| 2014/0291134 A1 | 10/2014 | Whitt, III et al. | |
| 2014/0328041 A1 | 11/2014 | Rothkopf et al. | |
| 2014/0362506 A1 | 12/2014 | Whitt, III et al. | |
| 2014/0379942 A1 | 12/2014 | Perek et al. | |
| 2015/0036274 A1 | 2/2015 | Belesiu et al. | |
| 2015/0277505 A1 | 10/2015 | Lim et al. | |
| 2015/0277506 A1 | 10/2015 | Cheah et al. | |
| 2016/0048174 A1 * | 2/2016 | Hsu | G06F 1/1681 16/342 |
| 2016/0083987 A1 * | 3/2016 | Xia | E05D 7/00 16/223 |
| 2016/0104991 A1 * | 4/2016 | Huang | H01R 39/64 403/42 |
| 2016/0130849 A1 | 5/2016 | Cheah et al. | |
| 2016/0132077 A1 | 5/2016 | Cheah et al. | |

(56) References Cited

U.S. PATENT DOCUMENTS

| | | | | |
|---|---|---|---|---|
| 2016/0139634 A1* | 5/2016 | Cho | ...................... | G06F 1/1652 361/679.27 |
| 2016/0147267 A1* | 5/2016 | Campbell | ............. | G06F 1/1681 361/679.27 |
| 2016/0201718 A1* | 7/2016 | Mak | ........................ | F16C 11/04 16/366 |

FOREIGN PATENT DOCUMENTS

| | | |
|---|---|---|
| CN | 103161819 | 6/2013 |
| CN | 103228114 | 7/2013 |
| CN | 103455101 | 12/2013 |
| EP | 1973311 | 9/2008 |
| JP | H10228333 | 8/1998 |
| JP | H11-112846 | 4/1999 |
| JP | 2000161341 | 6/2000 |
| JP | 2002229674 | 8/2002 |
| JP | 2004258820 | 9/2004 |
| JP | 2005336749 | 12/2005 |
| JP | 2006211394 | 8/2006 |
| JP | 2008228249 | 9/2008 |
| JP | 2009080562 | 4/2009 |
| JP | 2010065801 | 3/2010 |
| JP | 2010177879 | 8/2010 |
| JP | 2010218102 | 9/2010 |
| JP | 2013025617 | 2/2013 |
| KR | 20110100936 | 9/2011 |
| TW | 200417306 | 9/2004 |
| TW | M322689 | 11/2007 |
| TW | M453755 | 5/2013 |
| TW | 201410122 | 3/2014 |
| TW | I561740 | 12/2016 |
| WO | 2009115908 | 9/2009 |
| WO | 2015148057 | 10/2015 |
| WO | 2015153032 | 10/2015 |

OTHER PUBLICATIONS

United States Patent and Trademark Office, "Final Office Action," issued in connection with U.S. Appl. No. 14/996,568, dated Sep. 11, 2017, 12 pages.
Taiwanese Patent Office, "Notice of Allowance," issued in connection with Taiwanese Patent Application No. 104105092, dated Jul. 10, 2017, 3 pages (includes English translation).
Taiwanese Patent Office, "Office Action," issued in connection with Taiwanese Patent Application No. 105103130, dated Apr. 12, 2017, 4 pages.
Taiwanese Patent Office, "English Translation of Examination Opinion Notification," issued in connection with Taiwanese Patent Application No. 105103128, dated Jul. 21, 2016, 6 pages.
Taiwanese Patent Office, "English Translation of Examination Opinion Notification," issued in connection with Taiwanese Patent Application No. 104105092, dated Sep. 6, 2016, 7 pages.
Taiwanese Patent Office, "English Translation of Examination Opinion Notification," issued in connection with Taiwanese Patent Application No. 104105092, dated Feb. 17, 2016, 6 pages.
International Searching Authority, "International Search Report and Written Opinion," issued in connection with International Patent Application No. PCT/US2015/018207, dated May 19, 2015, 12 pages.
International Searching Authority, "International Search Report and Written Opinion," issued in connection with International Patent Application No. PCT/US2015/018204, dated Jun. 10, 2015, 14 pages.
Taiwanese Patent Office, "English Translation of Examination Opinion Notification," issued in connection with Taiwanese Patent Application No. 104105619, dated Dec. 15, 2015, 6 pages.
United States Patent and Trademark Office, "Corrected Notice of Allowability," issued in connection with U.S. Appl. No. 14/996,568, dated Jul. 5, 2018, 2 pages.

United States Patent and Trademark Office, "Final Office Action," issued in connection with U.S. Appl. No. 14/996,568, dated Sep. 11, 2017, 13 pages.
United States Patent and Trademark Office, "Non-final Office Action," issued in connection with U.S. Appl. No. 14/996,568, dated Apr. 20, 2017, 12 pages.
Taiwanese Patent Office, "Notice of Allowance," issued in connection with Taiwanese Patent Application No. 105103128, dated Dec. 3, 2018, 3 pages (inlcudes English translation).
Taiwanese Patent Office, "Notice of Allowance," issued in connection with Taiwanese Patent Application No. 105103130, dated Dec. 3, 2018, 3 pages (includes English translation).
Taiwanese Patent Office, "Office Action," issued in connection with Taiwanese Patent Application No. 105103128, dated Apr. 12, 2017, 3 pages.
Taiwanese Patent Office, "English Translation of Examination Opinion Notification and Search Report," issued in connection with Taiwanese Patent Application No. 105103130, dated Jul. 21, 2016, 8 pages.
Taiwanese Patent Office, "Official Letter," issued in connection with Taiwanese Patent Application No. 105103130, dated Mar. 27, 2018, 17 pages (includes English translation).
United States Patent and Trademark Office, "Notice of Allowance," issued in connection with U.S. Appl. No. 14/229,830, dated Feb. 9, 2016, 5 pages.
Korean Intellectual Property Office, "Notice of Preliminary Rejection," issued in connection with Korean Patent Application No. 2016-7023500, dated Oct. 31, 2018, 10 pages (includes English translation).
Japanese Patent Office, "Decision of Refusal," issued in connection with Japanese Patent Application No. 2016-553368, dated Jul. 31, 2018, 6 pages (includes English translation).
European Patent Office, "Extended European Search Report," issued in connection with European Application No. 15772483.2, dated Apr. 24, 2018, 7 pages.
State Intellectual Property Office of the People'S Republic of China, "English Translation of Notification of the First Office Action," issued in connection with Chinese Application No. 201580011089.4, dated Sep. 5, 2018, 13 pages.
United States Patent and Trademark Office, "Corrected Notice of Allowability," issued in connection with U.S. Appl. No. 14/998,225, dated Jul. 5, 2018, 4 pages.
United States Patent and Trademark Office, "Notice of Allowance," issued in connection with U.S. Appl. No. 14/998,225, dated Feb. 16, 2018, 11 pages.
United States Patent and Trademark Office, "Non-final Office Action," issued in connection with U.S. Appl. No. 14/998,225, dated Apr. 19, 2017, 25 pages.
Taiwanese Patent Office, "Search Report," issued in connection with Taiwanese Patent Application No. 106127122, dated Mar. 21, 2018, 2 pages (includes English translation).
Japanese Patent Office, "Decision to Grant," issued in connection with Japanese Patent Application No. 2016-553368, dated Jan. 8, 2019, 2 pages (includes partial English Translation).
International Searching Authority, "International Preliminary Report on Patentability," issued in connection with International Patent Application No. PCT/US2015/018207, dated Oct. 4, 2016, 9 pages.
United States Patent and Trademark Office, "Non-final Office Action," issued in connection with U.S. Appl. No. 14/229,830, dated Sep. 30, 2015, 12 pages.
Taiwanese Patent Office, "Notice of Allowance," issued in connection with Taiwanese Patent Application No. 106127122, dated Mar. 7, 2019, 3 pages (includes English translation).
Taiwanese Patent Office, "English Translation of Examination Opinion Notification," issued in connection with Taiwanese Patent Application No. 106127122, dated May 11, 2018, 6 pages (includes English translation).
Taiwanese Patent Office, "Official Letter," issued in connection with Taiwanese Patent Application No. 105103128, dated Mar. 28, 2018, 11 pages (includes English translation).

(56) References Cited

OTHER PUBLICATIONS

Korean Intellectual Property Office, "Notice of Preliminary Rejection," issued in connection with Korean Patent Application No. 2016-7023500, dated Dec. 18, 2017, 11 pages (includes English translation).

European Patent Office, "Invitation Pursuant to Rule 63(1) EPC" issued in connection with European Application No. 15772483.2, dated Dec. 14, 2017, 3 pages.

United States Patent and Trademark Office, "Non-final Office Action," issued in connection with U.S. Appl. No. 14/229,835, dated Nov. 10, 2015, 9 pages.

United States Patent and Trademark Office, "Final Office Action," issued in connection with U.S. Appl. No. 14/229,835, dated Apr. 13, 2016, 13 pages.

International Searching Authority, "International Preliminary Report on Patentability," issued in connection with International Patent Application No. PCT/US2015/018204, dated Oct. 4, 2016, 9 pages.

State Intellectual Property Office of the People's Republic of China, "Second Office Action," issued in connection with Chinese Application No. 201580011089.4, dated May 22, 2019, 17 pages (includes English translation).

European Patent Office, "Communication Pursuant to Article 94(3) EPC," issued in connection with application No. 15772483.2, dated Oct. 18, 2019, 5, pages.

The State Intellectual Property Office of China, "First Office Action," issued in connection with application No. 201710219949.4 dated Jul. 18, 2019, 10 pages. (English translation included).

The State Intellectual Property Office of China, "First Office Action," issued in connection with application No. 201710219937.1 dated Jul. 15, 2019, 24 pages. (English translation included).

Korean Intellectual Property Office, "Notice of Allowance," issued in connection with application No. 10-2016-7023500 dated May 31, 2019, 3 pages. (English translation included).

Chinese Patent Office, "Notice of Rejection," issued in connection with Chinese Patent Application No. 201580011089.4, on Nov. 25, 2019, 7 pages.

Japanese Patent Office, "Notice of Reasons for Refusal," issued in connection with Japanese Patent Application No. 2018-225601, dated Jan. 30, 2020, 7 pages (includes English translation).

Tawainese Patent Office, "Official Letter and Search Report," issued in connection with Taiwanese Patent Application No. 107140342, dated on Feb. 6, 2020, 5 pages (includes English translation of Search Report).

* cited by examiner

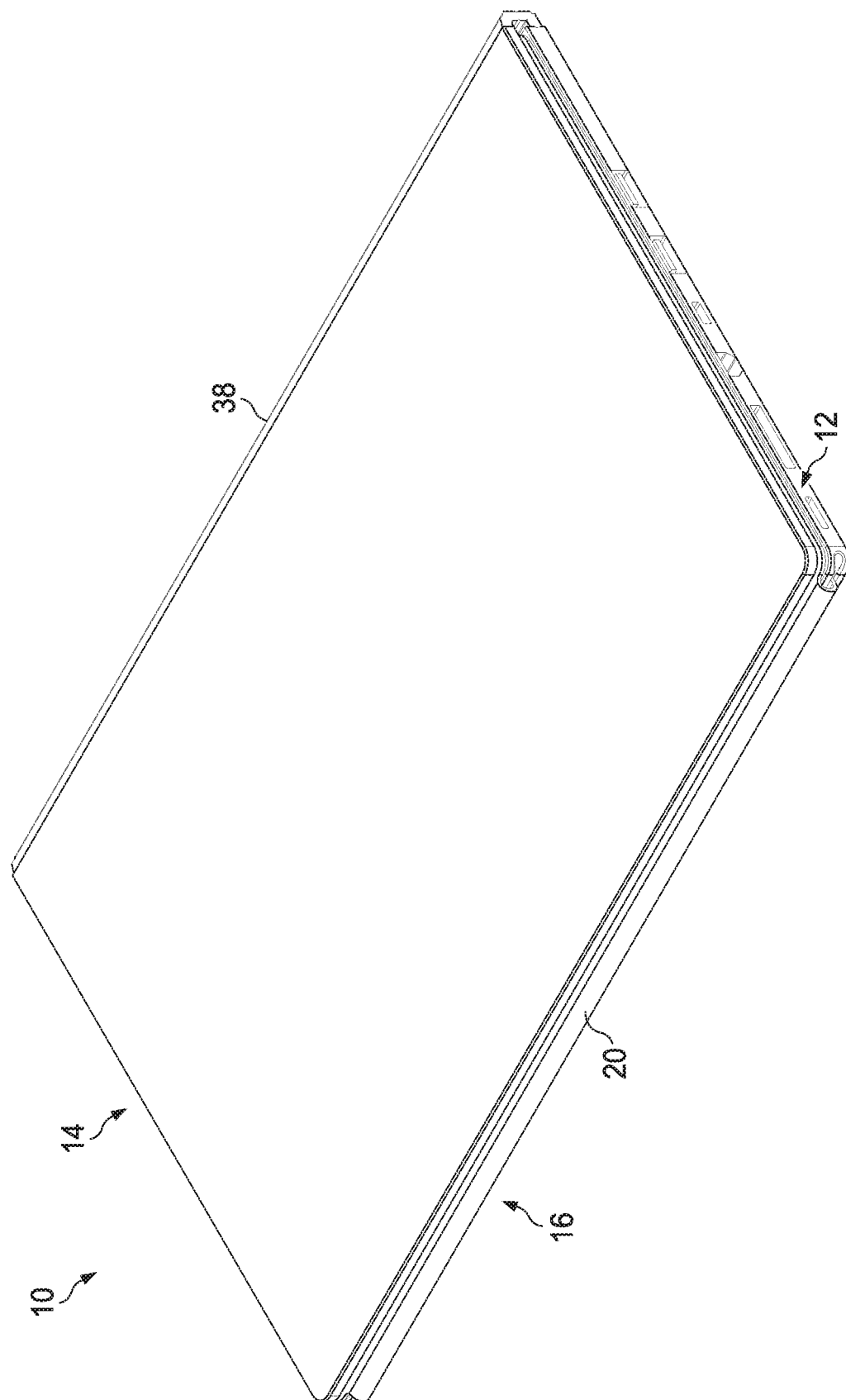

MICRO-HINGE FOR AN ELECTRONIC DEVICE

RELATED APPLICATIONS

This patent is a continuation of, claims the benefit of and priority to previously filed U.S. patent application Ser. No. 14/996,568 (now U.S. Pat. No. 10,036,187), filed on Jan. 15, 2016, which is entitled "MICRO-HINGE FOR AN ELECTRONIC DEVICE," which is a continuation of, claims the benefit of and priority to previously filed U.S. patent application Ser. No. 14/229,835, filed Mar. 29, 2014, entitled "MICRO-HINGE FOR AN ELECTRONIC DEVICE." The subject matter of these applications is incorporated herein by reference in their entireties.

FIELD OF THE DISCLOSURE

Embodiments described herein generally relate to the field of hinges, and more particularly, to a micro-hinge for an electronic device.

BACKGROUND

End users have more electronic device choices than ever before. A number of prominent technological trends are currently afoot (e.g., more computing devices, more devices that can change into different configurations, etc.), and these trends are changing the electronic device landscape. One of the technological trends is a hybrid laptop (e.g., a convertible computer, fold over notebook etc.). A hybrid laptop is a one-piece mobile computer that can include a laptop configuration and a tablet configuration. To convert from the laptop configuration to the tablet configuration, often the display or screen can rotate, twist, or spin over a keyboard. While hybrid laptops are a compelling way of delivering convertibility from a laptop configuration to a tablet configuration, in some designs, the hinge can be bulky and limit the form-factor of the device.

BRIEF DESCRIPTION OF THE DRAWINGS

Embodiments are illustrated by way of example and not by way of limitation in the FIGURES of the accompanying drawings, in which like references indicate similar elements and in which:

FIG. 1A is a simplified orthographic diagram illustrating an embodiment of an electronic device in a closed clamshell configuration, in accordance with one embodiment of the present disclosure;

Figure 1B:
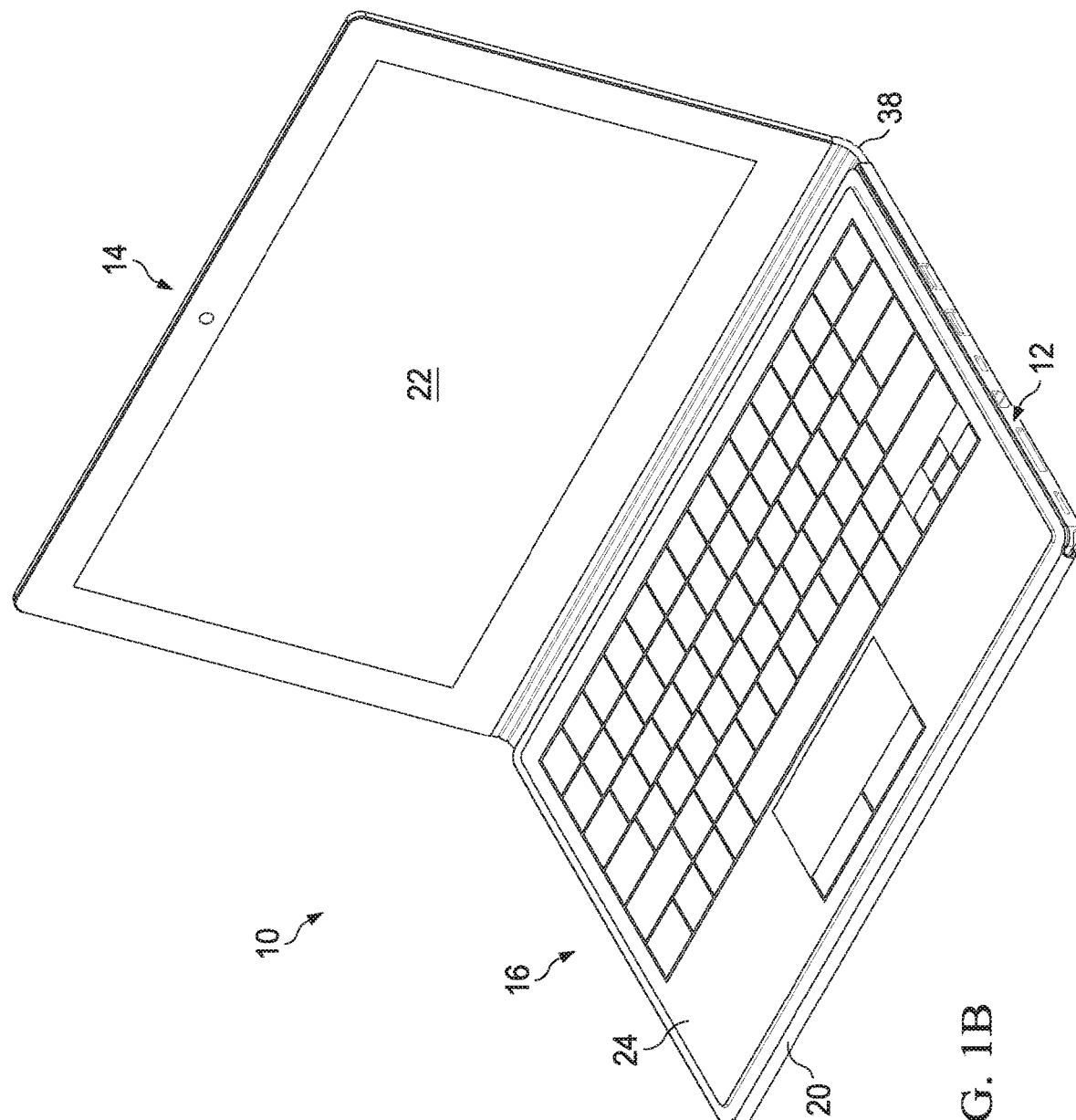
FIG. 1B is a simplified orthographic diagram illustrating an embodiment of an electronic device in an open clamshell configuration, in accordance with one embodiment of the present disclosure.

The FIGURES of the drawings are not necessarily drawn to scale, as their dimensions can be varied considerably without departing from the scope of the present disclosure.

DETAILED DESCRIPTION OF THE EMBODIMENTS

Overview

In an example, there is disclosed a system an apparatus, and a method for a low profile hinge design. In one example embodiment, the low profile hinge can include a micro-hinge. The micro-hinge can couple or connect a first element to a second element and can include a first attachment that couples to the first element, a second attachment that couples to the second element, and a plurality of linkages that couples the first attachment to the second attachment. The low profile hinge can rotate about three hundred and sixty degrees. The low profile hinge can further include a plurality of micro-hinges and a plurality of support rods. Also, the low profile hinge can include a flexible covering. In one example, the low profile hinge extends about the length of the first element and the second element. In addition, the micro-hinge can include an electrical conduit. In some examples, the first element is a base portion of an electronic device and the second element is a display portion of the electronic device.

Example Embodiments of the Disclosure

A hybrid laptop is a one-piece mobile computer that can include a laptop configuration and a tablet configuration. To convert from the laptop configuration to the tablet configuration, often the display or screen can rotate, twist, or spin over a keyboard. While hybrid laptops are a compelling way of delivering convertibility from a laptop configuration to a tablet configuration, in some designs, the hinge can be bulky and limit the form-factor of the device. For example, the z-height of the device is often dependent on the hinge design.

Currently, form-factor limitations for electronic devices such as hybrid laptops are addressed by enabling ultra-low profile and small form-factor components (e.g., careless package and motherboard, connectors, batteries, etc.). The development of high-density super-capacitors is also being used to further reduce the battery form-factor and density to enable low profile platforms. However, the form factor for a low profile device is often limited by the hinge.

The foregoing is offered by way of non-limiting examples in which the system and method of the present specification may usefully be deployed. The following disclosure provides many different embodiments, or examples, for implementing different features of the present disclosure. Specific examples of components and arrangements are described below to simplify the present disclosure. These are, of course, merely examples and are not intended to be limiting. Further, the present disclosure may repeat reference numerals and/or letters in the various examples. This repetition is for the purpose of simplicity and clarity and does not in itself dictate a relationship between the various embodiments and/or configurations discussed. Different embodiments may have different advantages, and no particular advantage is necessarily required of any embodiment.

In the examples of the present specification, a system and method is provided for a low profile hinge design. In one example, using a micro-hinge design, a device (e.g., an electrical device) can be configured such that the hinge form-factor does not limit the scaling of the total z-height (height on the z-axis of an X, Y, Z, Cartesian coordinate system) of the device. The hinge can be a low profile, total collapsible, three hundred and sixty degree (360°) hinge. The total thickness of the hinge design can be scaled according to a desired z-height through configuring the dimension of the segment components of the hinge. Hence, the overall z-height of the device can be scaled based on the components of the device (e.g., the display portion, base portion, keyboard portion, etc.) and not limited by the hinge size. For example, using the low profile hinge design, an electronic device can operate in a low profile clamshell configuration, a low profile flat configuration, and a low profile tablet configuration.

The following is an illustration of an example of a micro-hinge design according to one or more example embodiments of the present specification. It should be noted that the hinge designs disclosed here are given as non-limiting examples only, and it is intended that any suitable technique or configuration should be included in the broad scope of this specification.

Example Embodiments

The following detailed description sets forth example embodiments of apparatuses, methods, and systems relating to micro-hinge configurations for an electronic device. Features such as structure(s), function(s), and/or characteristic(s), for example, are described with reference to one embodiment as a matter of convenience; various embodiments may be implemented with any suitable one or more of the described features.

Turning to FIG. 1A, FIG. 1A is a simplified orthographic view illustrating an embodiment of an electronic device 10 in a closed clamshell configuration in accordance with one embodiment of the present disclosure. Electronic device 10 may include a base portion 12, a display portion 14, a keyboard portion 16, a display hinge 38, and a keyboard hinge 20. Display hinge 38 can define an axis of rotation that is shared between base portion 12 and display portion 14. Keyboard hinge 20 can define an axis of rotation that is shared between base portion 12 and keyboard portion 16. In this configuration, keyboard hinge 20 and display hinge 38 can have a low, flat, or relatively flat profile with a low z-height. As used throughout this Specification, the z-height is the height on the z-axis of an X, Y, Z Cartesian coordinate system. In an embodiment, keyboard hinge 20 is a different type of hinge than display hinge 38 and may be a flexible fabric, molded flexible polymer, or some other similar thin flexible material.

In one or more embodiments, electronic device 10 is a notebook computer or laptop computer. In still other embodiments, electronic device 10 may be any suitable electronic device having a display such as a mobile device, a tablet computer and/or a tablet device (e.g., iPad™), phablet, a personal digital assistant (PDA), a smartphone, an audio system, a movie player of any type, a computer docking station, etc. In yet another embodiment, most of the electronics (e.g., processor, memory, etc.) for electronic device 10 reside in base portion 12.

Turning to FIG. 1B, FIG. 1B is a simplified orthographic view of electronic device 10 in an open clamshell configuration in accordance with one embodiment of the present disclosure. As illustrated in FIG. 1B, display portion 14 has been rotated on display hinge 38. Keyboard portion 16 has been rotated on keyboard hinge 20.

Keyboard portion 16 can include a keyboard 24. Display portion 14 can include a display 22. In one or more embodiments, display 22 can be a liquid crystal display (LCD) display screen, a light-emitting diode (LED) display screen, an organic light-emitting diode (OLED) display screen, a plasma display screen, or any other suitable display screen system. Display 22 may be a touchscreen that can detect the presence and location of a touch within the display area. In another embodiment, display portion 14 may contain a camera, a microphone, and speakers.

Figure 1C:
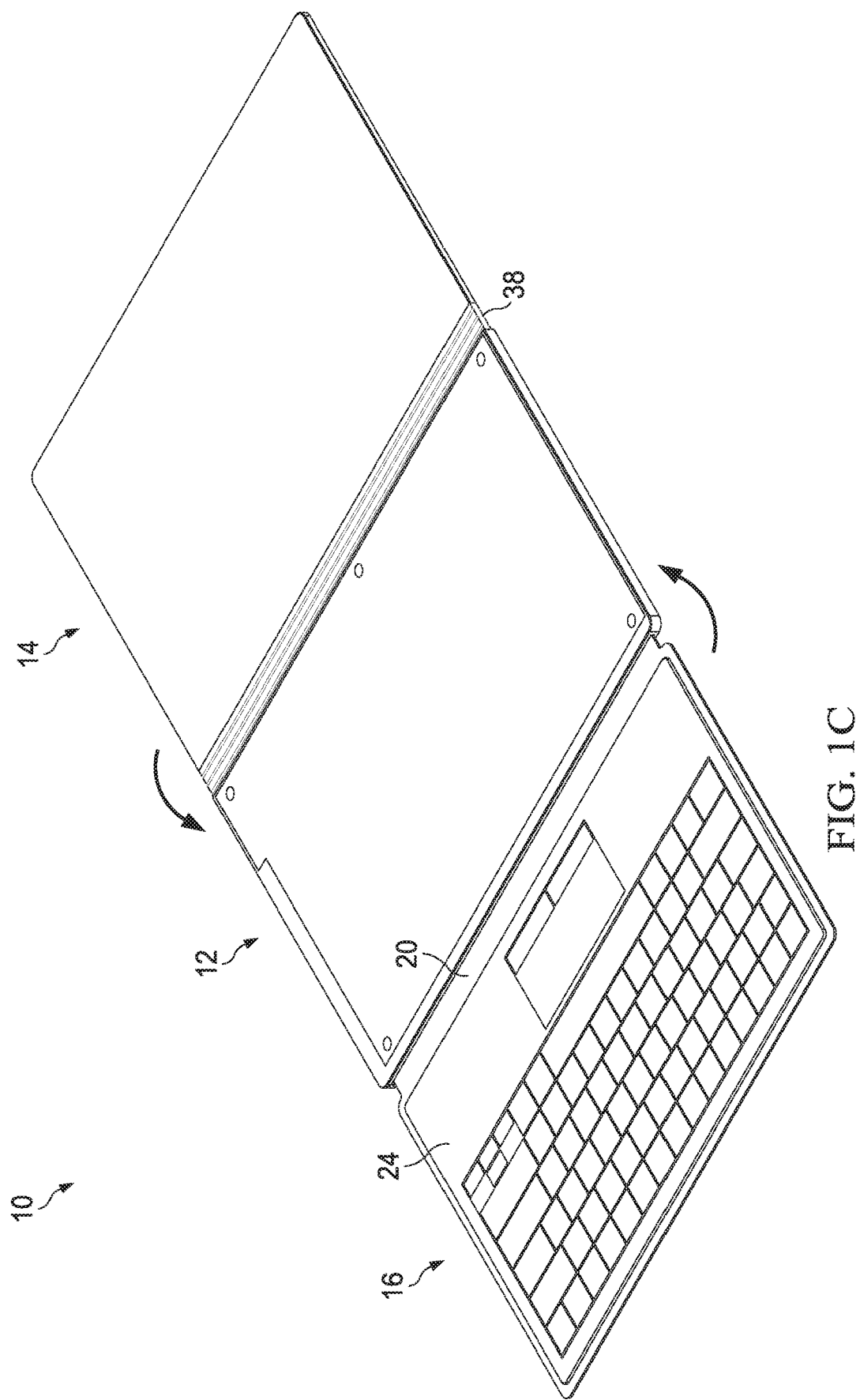
FIG. 1C is a simplified orthographic diagram illustrating an embodiment of an electronic device in an open flat configuration, in accordance with one embodiment of the present disclosure.

Turning to FIG. 1C, FIG. 1C is a simplified orthographic view of electronic device 10 in an open flat configuration in accordance with one embodiment of the present disclosure. As illustrated, in FIG. 1C, display portion 14 has been rotated on display hinge 38 such that display portion 14 is in the same plane as base portion 12. In addition, keyboard portion 16 has been rotated on keyboard hinge 20 such that keyboard portion 16 is also in the same plane as base portion 12. Keyboard hinge 20 and display hinge 38 are configured to lay relatively flat on a planer surface and allow electronic device 10 to have a low, flat, or relatively flat profile with a low z-height when electronic device 10 is in the flat configuration.

Figure 1D:
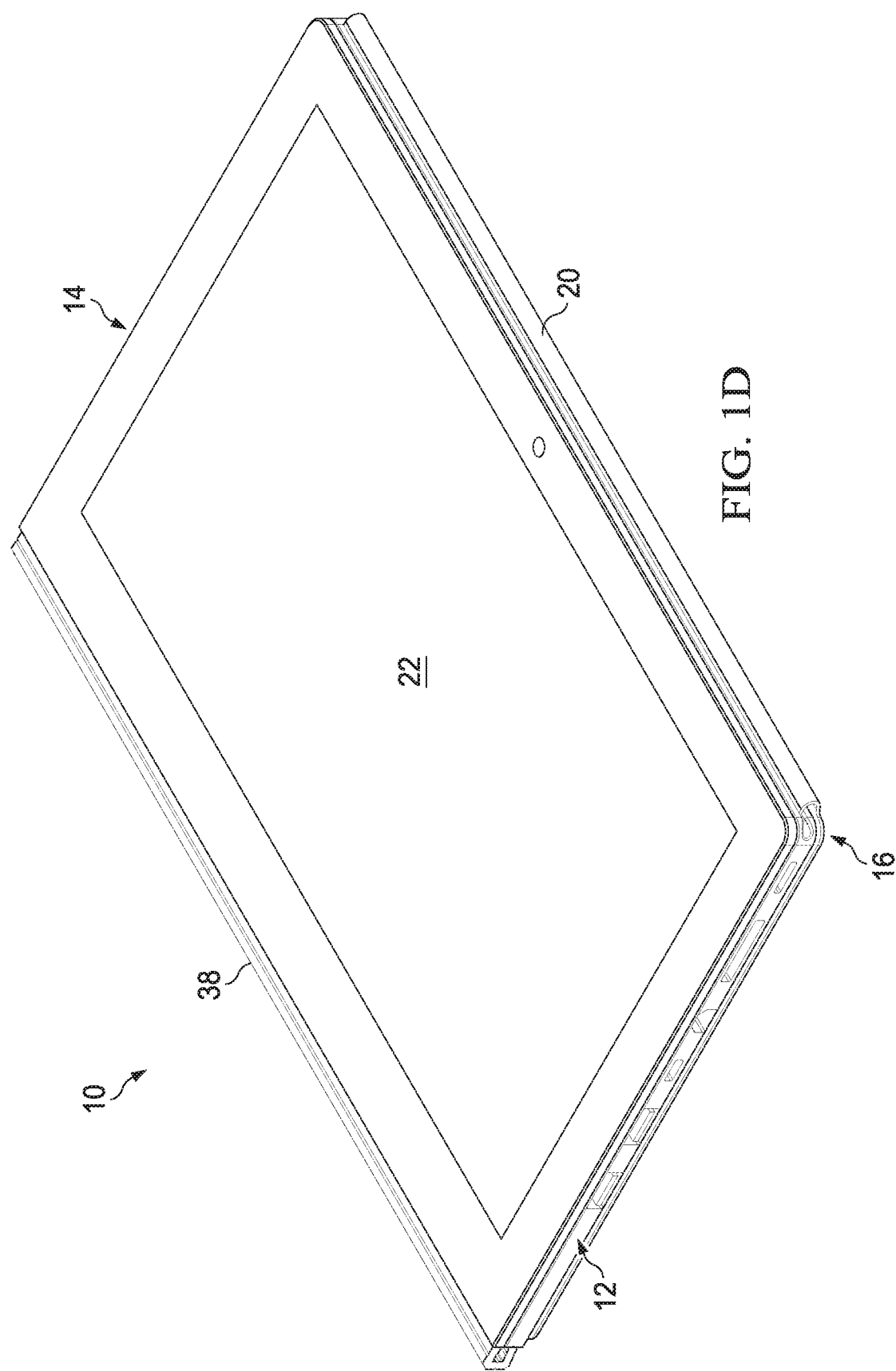
FIG. 1D is a simplified orthographic diagram illustrating an embodiment of an electronic device in a tablet configuration, in accordance with one embodiment of the present disclosure.

Turning to FIG. 1D, FIG. 1D is a simplified orthographic view of electronic device in a tablet configuration in accordance with one embodiment of the present disclosure. As illustrated in FIG. 1D, display portion 14 has been rotated on display hinge 38 such that display 22 faces up and away from base portion 12. In addition, keyboard portion 16 has been rotated on keyboard hinge 20 such that keyboard 24 (not shown) faces down and away from base portion 12. In this configuration, display 22 is facing up while on the opposite side, keyboard 24 is facing down. Base portion 12 is between display portion 14 and keyboard portion 16. Keyboard hinge 20 and display hinge 38 are configured to have a low profile and allow electronic device 10 to have a low, flat, or relatively flat profile with a low z-height when electronic device 10 is in the tablet configuration.

Figure 1E:
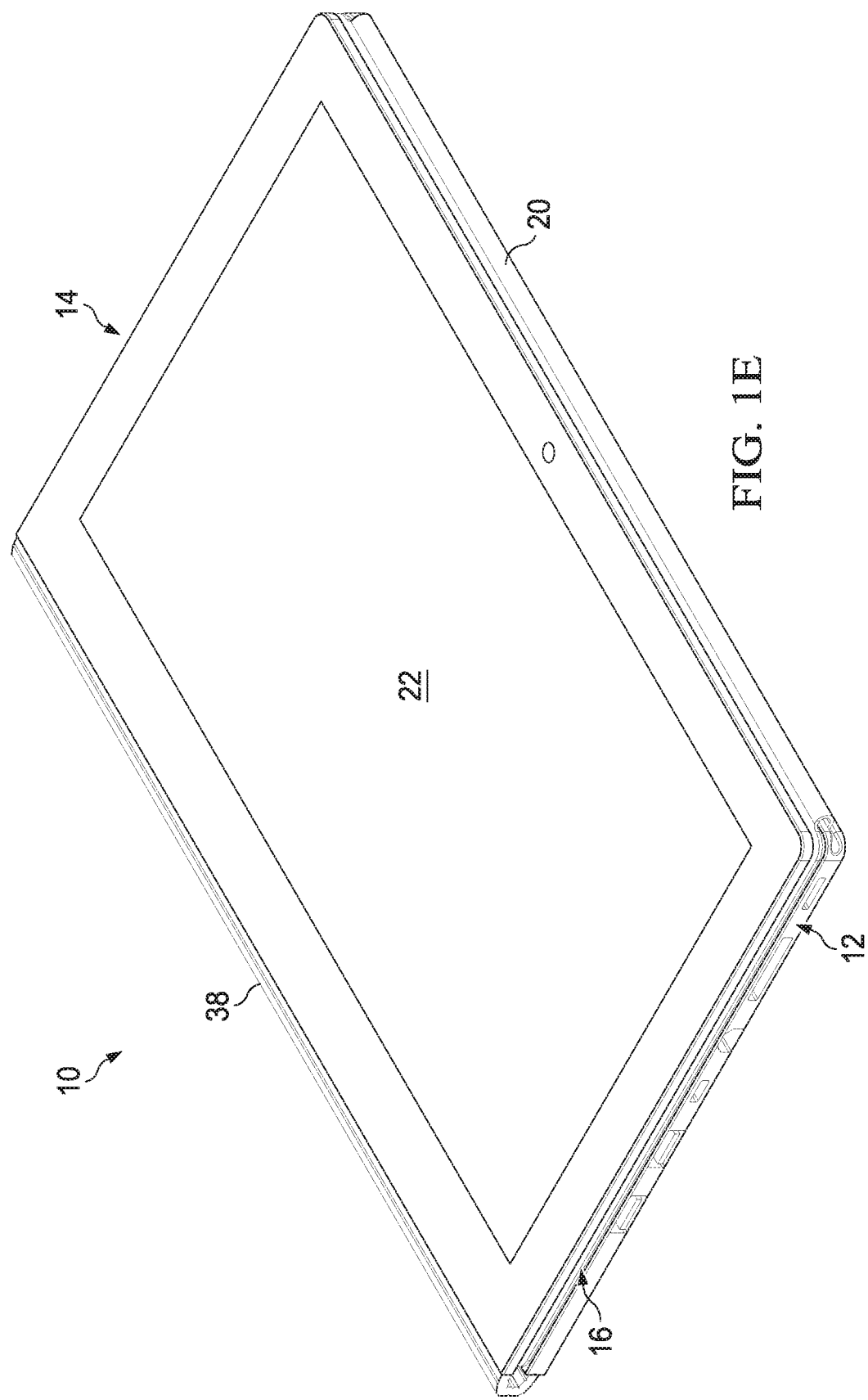
FIG. 1E is a simplified orthographic diagram illustrating an embodiment of an electronic device in a tablet configuration, in accordance with one embodiment of the present disclosure.

Turning to FIG. 1E, FIG. 1E is a simplified orthographic view of electronic device in a tablet configuration in accordance with one embodiment of the present disclosure. As illustrated in FIG. 1E, display portion 14 has been rotated on display hinge 38 such that display 22 faces up and away from base portion 12. In addition, keyboard portion 16 has been rotated on keyboard hinge 20 such that keyboard 24 (not shown) faces downward and towards base portion 12. In this configuration, keyboard portion 16 is facing down and is between base portion 12 and display portion 14. In another embodiment, keyboard portion 16 may be rotated on keyboard hinge 20 such that keyboard 24 faces downward and towards display portion 14 and serves as protective layer for display 22. In this configuration, display portion 14 is between base portion 12 and keyboard portion 16.

In general terms, electronic device 10 may be configured to provide a display portion and a keyboard portion coupled to a base portion using a micro-hinge design. The micro-hinge can be configured such that the display portion and the keyboard portion can be rotated about 360° around the base portion. The overall system can be configured to operate in a low profile clamshell mode configuration, a low profile flat mode configuration, and a low profile tablet mode configuration with a low z-height.

For purposes of illustrating certain example features of electronic device 10, the following foundational information may be viewed as a basis from which the present disclosure may be properly explained. With the recent touch optimized operating system (OS) release for hybrid laptops (e.g., tablets, convertible laptops, clamshell computers, etc.) have become more popular. However, convertible hinge designs have drawbacks with usability issues for certain consumer groups. For example, current hinge solutions can have bulky hinge components that can create a large profile and inhibit the functionality and usability of an electronic device. For example, bulky hinge components can constrain hybrid electronic devices or 2-in-1 form-factor scaling.

Presently the hybrid electronic devices and convertible form-factor limitations are addressed by enabling low profile and small form-factor components (e.g., coreless package and motherboard, connectors, batteries, etc.). High-density super-capacitors are also being developed to further reduce the battery form-factor and density. In at least one example embodiment discussed herein, an electrical device can be configured with a low profile hinge design where the overall system can operate in a low profile clamshell configuration, a low profile flat configuration, and a low profile tablet configuration with a low z-height. The low profile hinge can prevent the hinge form-factor from limiting the scaling of system total z-height by enabling a low profile total collapse, 360° hinge using a micro-hinge segment design. The total thickness of the hinge can be scaled according to system z-height through configuring the dimension of segment components. Hence, the overall system z-height can be scaled based on the display portion and keyboard portion and not limited by the hinge size.

Particular embodiments described herein provide for an electronic device, such as a notebook computer, laptop, cellphone, or other mobile device that includes a circuit board coupled to a plurality of electronic components (which includes any type of components, elements, circuitry, etc.). The electronic device may also include a display portion and a keyboard portion coupled to a base using a micro-hinge. The micro-hinge can be configured to allow a low profile 360° hinge design for hybrid electronic devices and 2-in-1 applications. The micro-hinge includes micro-hinge links. The micro-hinge links can be embedded in or covered with a molded flexible polymer (e.g., polyurethane or some other rubber like material). The micro-hinge is mechanically coupled or connected to the display portion (e.g., display panel) and base portion (e.g., system board components) to form the electronic device.

The micro-hinge link mechanism is designed to provide guidance and support when the main body of the micro-hinge (e.g., support rods) is being bent. For example, the main body can include a bundle of flexible support rods enclosed in polymer heat shrink. The micro-hinge link mechanism (with support rods) can be relatively durable and able to withstand several flipping cycles without mechanical breakdowns. The micro-hinge link can include a mechanical support structure. The mechanical support structure can include metal rods such as thin stainless steel rods with a diameter of about 0.5 mm. Polymer based composite materials may also be used and can provide improved mechanical reliability and durability.

The electrical connections between the base portion and the display portion can be established through an interconnection embedded or over-molded in the micro-hinge. The micro-hinge can include connectors and mechanical retentions to provide an electrical connection between the display portion and the base portion. In one embodiment, the electrical connections between a motherboard in the base portion and display components in the display portion can be formed through conventional wire-connections via the micro-hinge. In another embodiment, a printed circuit board (PCB) interconnector may be used to electrically connect the display portion and the keyboard portion. In other examples, electrical current and signals can be passed through a plug-in connector (e.g., whose male side protrusion connects to the display portion 14 and whose female side connects to the base portion 12 or vice-versa) or a wireless connector (e.g., Wi-Fi, Bluetooth, etc.). Note that any number of connectors (e.g., Universal Serial Bus (USB) connectors (e.g., in compliance with the USB 3.0 Specification released in November 2008), Thunderbolt™ connectors, a non-standard connection point such as a docking connector, etc.) can be provisioned in conjunction with electronic device 10. [Thunderbolt™ and the Thunderbolt logo are trademarks of Intel Corporation in the U.S. and/or other countries.]. Virtually any other electrical connection methods could be used and, thus, are clearly within the scope of the present disclosure.

In an embodiment, the majority of the system components (e.g., motherboard, hard drive, battery, communication modules, etc.) remain in the base portion. In certain embodiments, the display can be a touchscreen display. The display portion may also contain a camera module, microphone, speakers, and/or a wireless module. Such a design allows the electronic device to function in a clamshell configuration or a tablet configuration. In an embodiment, the display includes a plurality of electrical components that allow the display portion to function or operate as a tablet.

Figure 2:
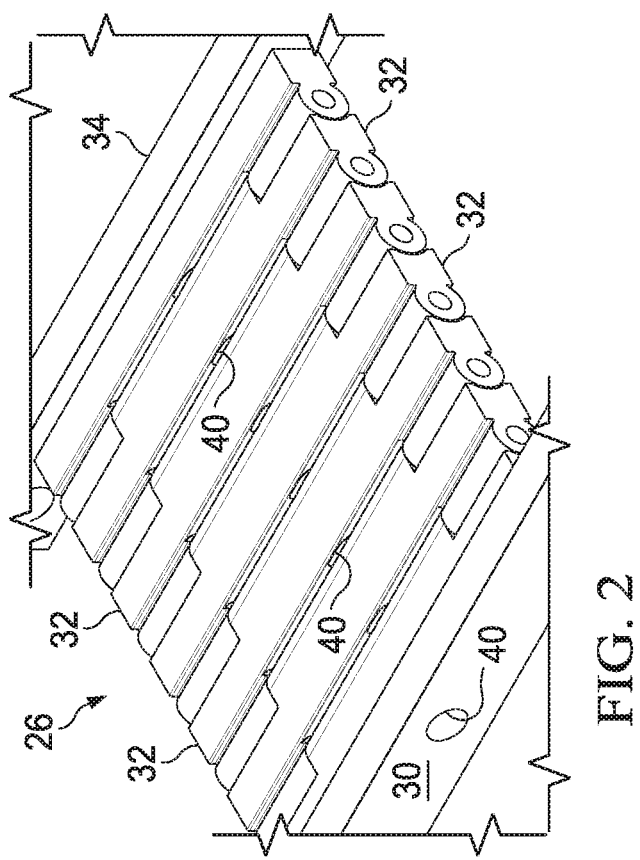
FIG. 2 is a simplified orthographic diagram illustrating an embodiment of a portion of a hinge, in accordance with one embodiment of the present disclosure.

Turning to FIG. 2, FIG. 2 is a simplified orthographic view illustrating an embodiment of a portion of micro-hinge 26, in accordance with one embodiment of the present disclosure. Micro-hinge 26 can include a base attachment 30, linkage 32, a display attachment 34, and an electrical conduit 40. Base attachment 30 can couple or connect to base portion 12. Display attachment 34 can couple or connect to display portion 14. Linkage 32 allows micro-hinge 26 to be flexible and rotate about 360° while having a low profile. Electrical conduit 40 can allow electrical connections between base portion 12 and display portion 14.

Figure 3:
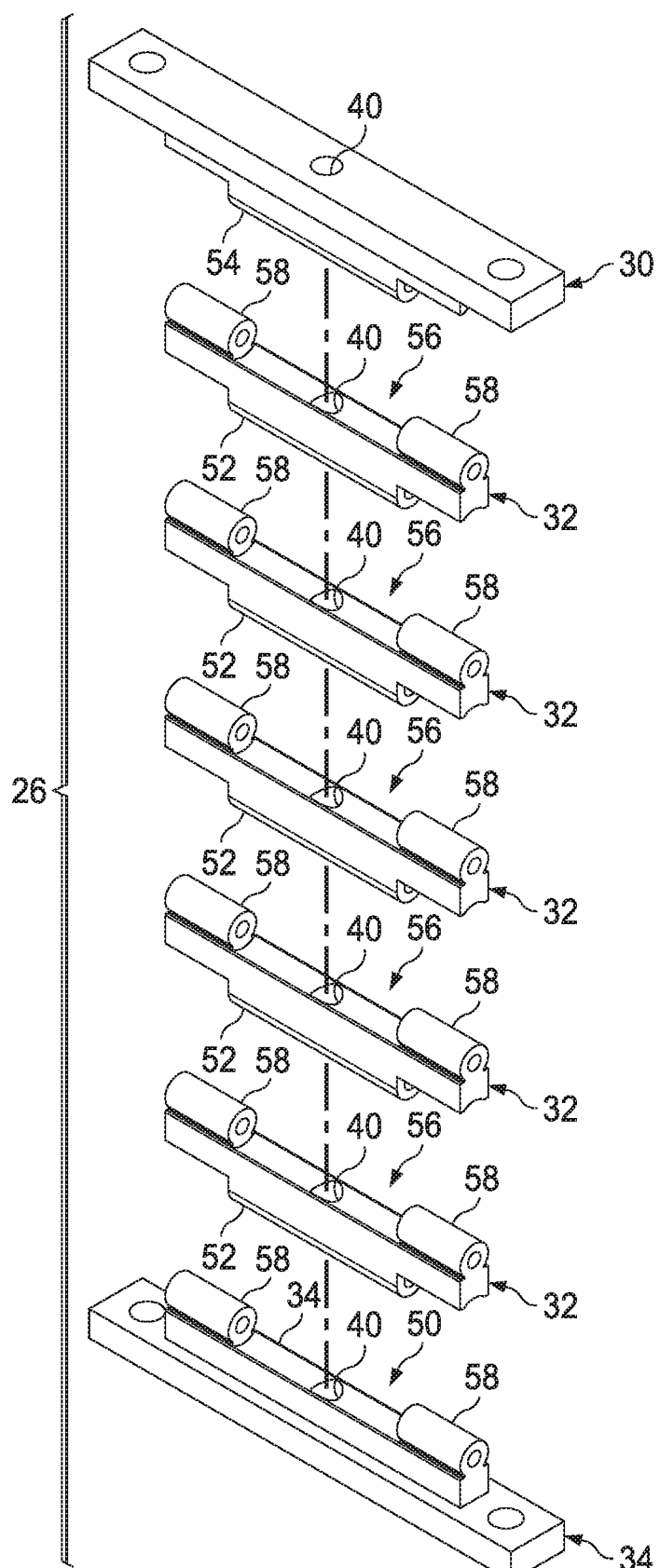
FIG. 3 is a simplified orthographic diagram illustrating an embodiment of a portion of a hinge, in accordance with one embodiment of the present disclosure.

Turning to FIG. 3, FIG. 3 is a simplified orthographic exploded view illustrating an embodiment of a portion of micro-hinge 26. Base attachment 30 can include electrical conduit 40 and a base linkage attachment 54. Linkage 32 can include electrical conduit 40, a link linkage attachment 52, an attachment area 56, and an attachment support 58. Attachment area can receive base linkage attachment 54 or link linkage attachment 52 from another link 32. Display attachment 34 can include electrical conduit 40, a linkage attachment area 50, and attachment support 58.

When base linkage attachment 54 on base attachment 30 is inserted into attachment area 56, a pin, rod, or some other securing means can be inserted through attachment support 58 and through base linkage attachment 54 to secure base attachment 30 to linkage 32. Similarly, when linkage attachment 52 on another linkage 32 is inserted into attachment area 56, a pin, rod, or some other securing means can be inserted through attachment support 58 and through link linkage attachment 52 (on another linkage 32) to secure another linkage 32 to linkage 32. In addition, when link linkage attachment 52 is inserted into linkage attachment area 50 on display attachment 34, a pin, rod, or some other securing means can be inserted through attachment support 58 and through link linkage attachment 52 to secure linkage 32 to display attachment 34. Base linkage attachment 54 can rotate while secured in attachment area 56. Similarly, link linkage attachment 52 can also rotate while secured in attachment area 56 and linkage attachment area 50. This configuration gives micro-hinge 26 the flexibility to rotate about 360° while having a low profile.

Figure 4:
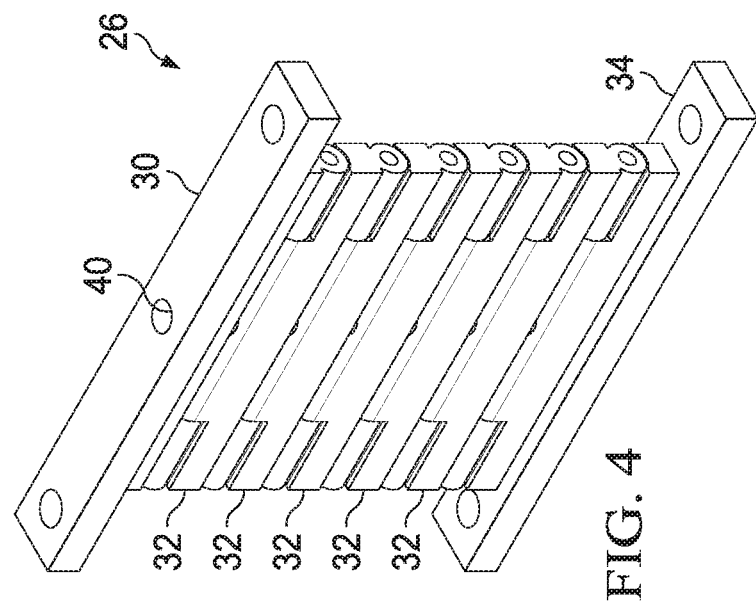
FIG. 4 is a simplified orthographic diagram illustrating an embodiment of a portion of a hinge, in accordance with one embodiment of the present disclosure.

Turning to FIG. 4, FIG. 4 is a simplified orthographic view illustrating an embodiment of micro-hinge 26. Several linkages 32 can be stacked together to allow for a thickness of base portion 12, display portion 14, and/or keyboard portion 16. For example, if base portion 12, display portion 14, and/or keyboard portion 16 were relatively thin, then fewer linkages 32 would need to be stacked together than if base portion 12, display portion 14, and/or keyboard portion 16 were relatively thick.

Figure 5A:
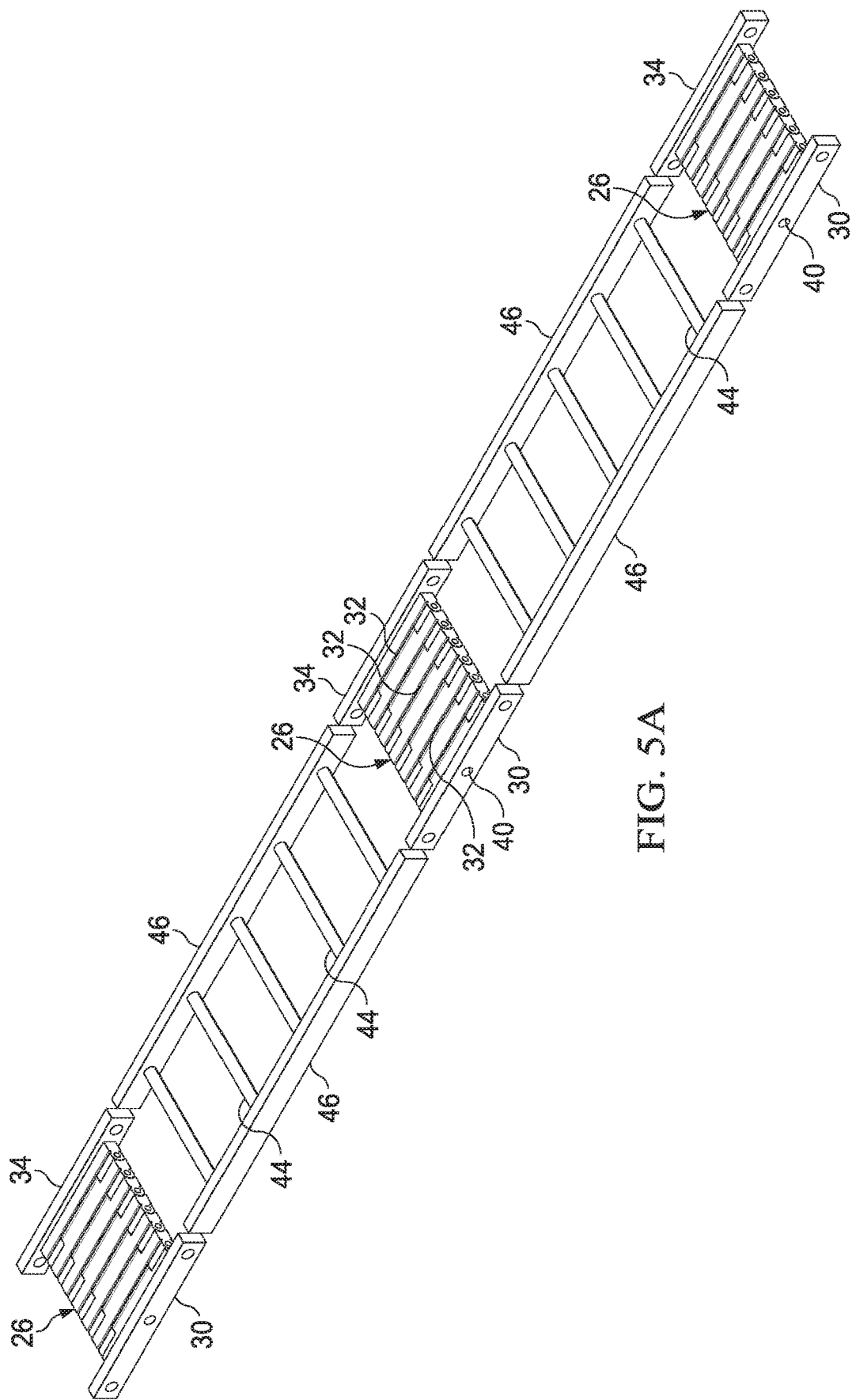
FIG. 5A is a simplified orthographic diagram illustrating an embodiment of a portion of an electronic device, in accordance with one embodiment of the present disclosure.

Turning to FIG. 5A, FIG. 5A is a simplified orthographic view illustrating an embodiment of a portion of display hinge 38, in accordance with one embodiment of the present disclosure. Display hinge 38 can include micro-hinge 26, base attachment 30, display attachment 34, an electrical conduit 40, a plurality of support rods 44, and support arms 46. Micro-hinge 26 can include linkage 32. Support arms 46 can couple or connect plurality of support rods 44 to base portion 12 and display portion 14. As illustrated in FIG. 5A, display hinge 38 is in an open flat configuration (similar to FIG. 6B illustrated below). Display hinge 38 is illustrated without covering 42, however, in some examples, covering 42 may cover all or a portion of display hinge 38. In an embodiment, electrical conduit 40 may be configured to accommodate support rod 44 such that support rod 44 is contained in micro-hinge 26 and provides support to micro-hinge 26.

Figure 5B:
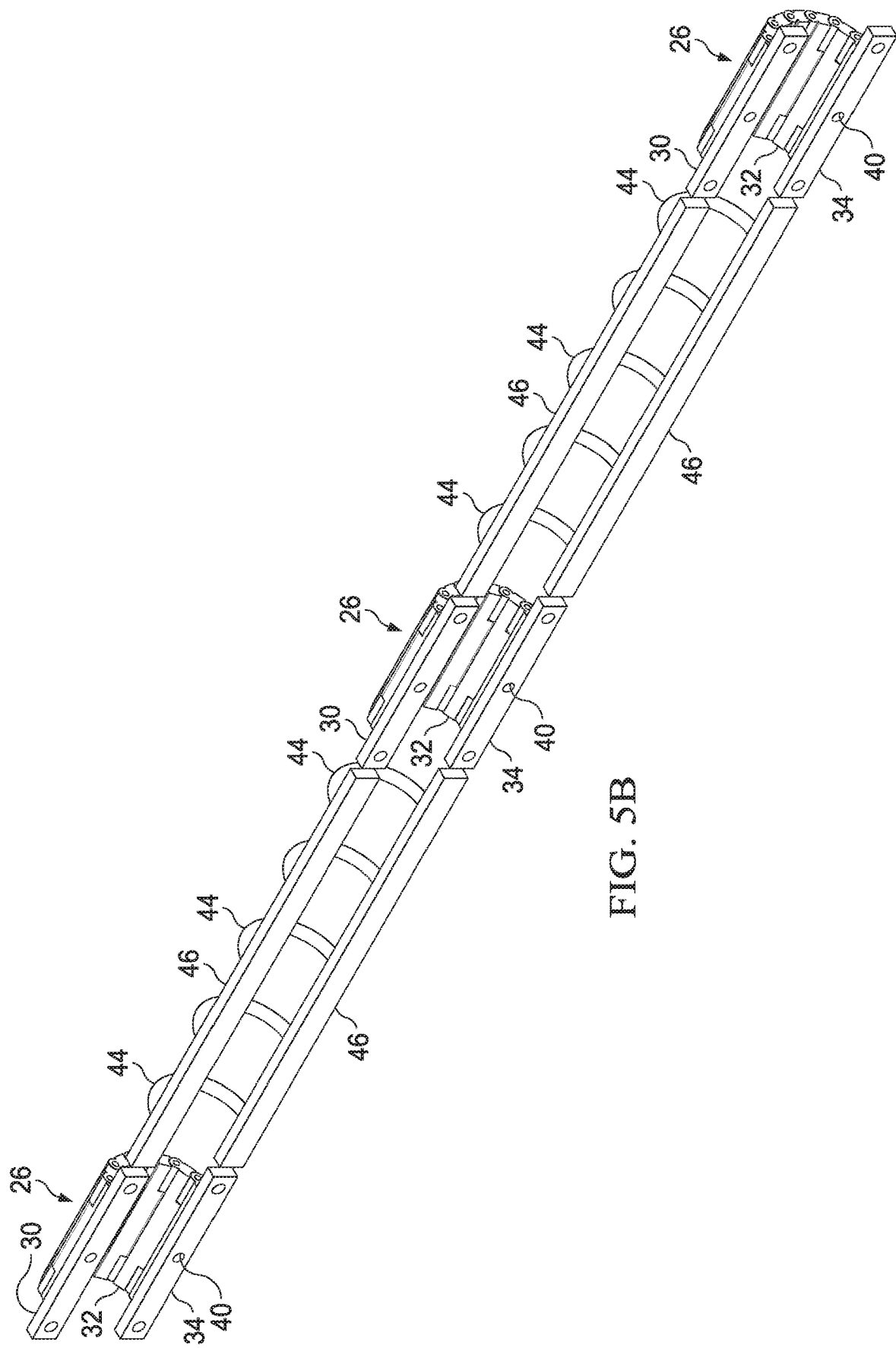
FIG. 5B is a simplified orthographic diagram illustrating an embodiment of a portion of an electronic device, in accordance with one embodiment of the present disclosure.

Turning to FIG. 5B, FIG. 5B is a simplified orthographic view illustrating an embodiment of a portion of display hinge 38, in accordance with one embodiment of the present disclosure. As illustrated in FIG. 5B, display hinge 38 may be in a closed clamshell configuration (similar to FIG. 6C illustrated below) or a tablet configuration (similar to FIG. 6D illustrated below). Plurality of support rods 44 are flexible enough to bend and flex with micro-hinge 26 yet strong enough to provide support for display portion 14 when electronic device is in an open clamshell configuration.

Figure 6A:
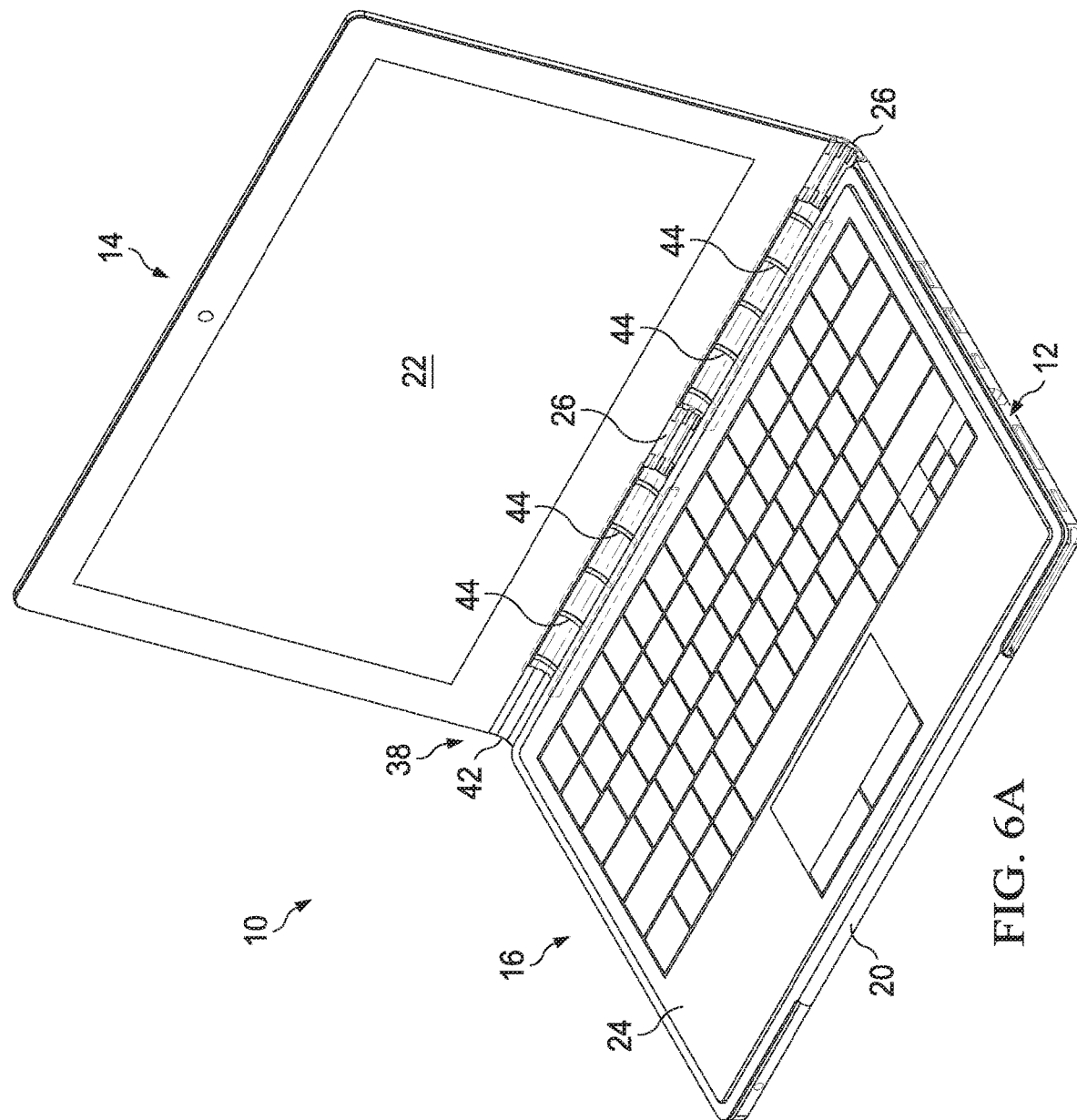
FIG. 6A is a simplified orthographic diagram illustrating an embodiment of an electronic device in an open clamshell configuration, in accordance with one embodiment of the present disclosure.
Figure 6B:
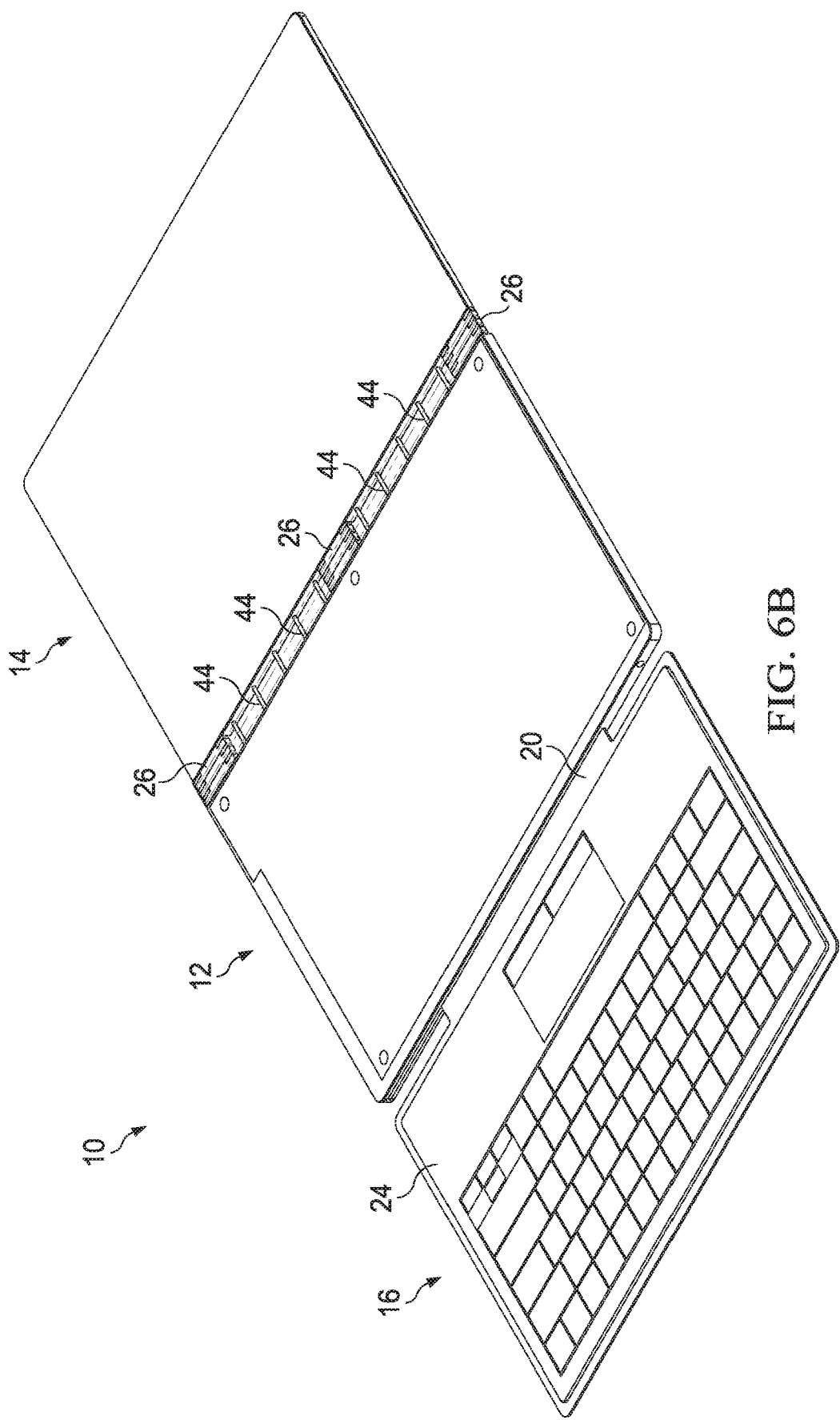
FIG. 6B is a simplified orthographic diagram illustrating an embodiment of an electronic device in an open flat configuration, in accordance with one embodiment of the present disclosure.
Figure 6C:
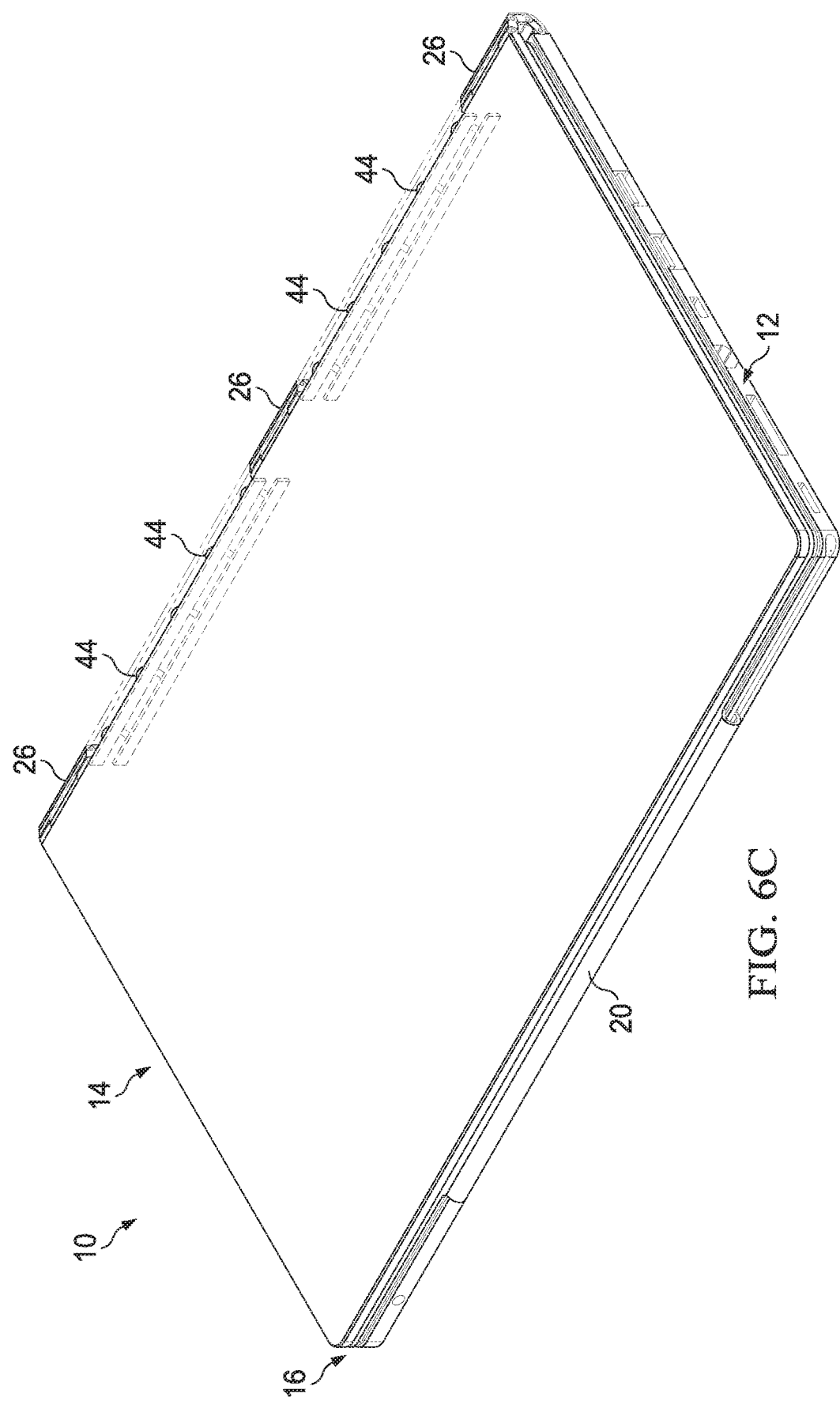
FIG. 6C is a simplified orthographic diagram illustrating an embodiment of an electronic device in a closed clamshell configuration, in accordance with one embodiment of the present disclosure.
Figure 6D:
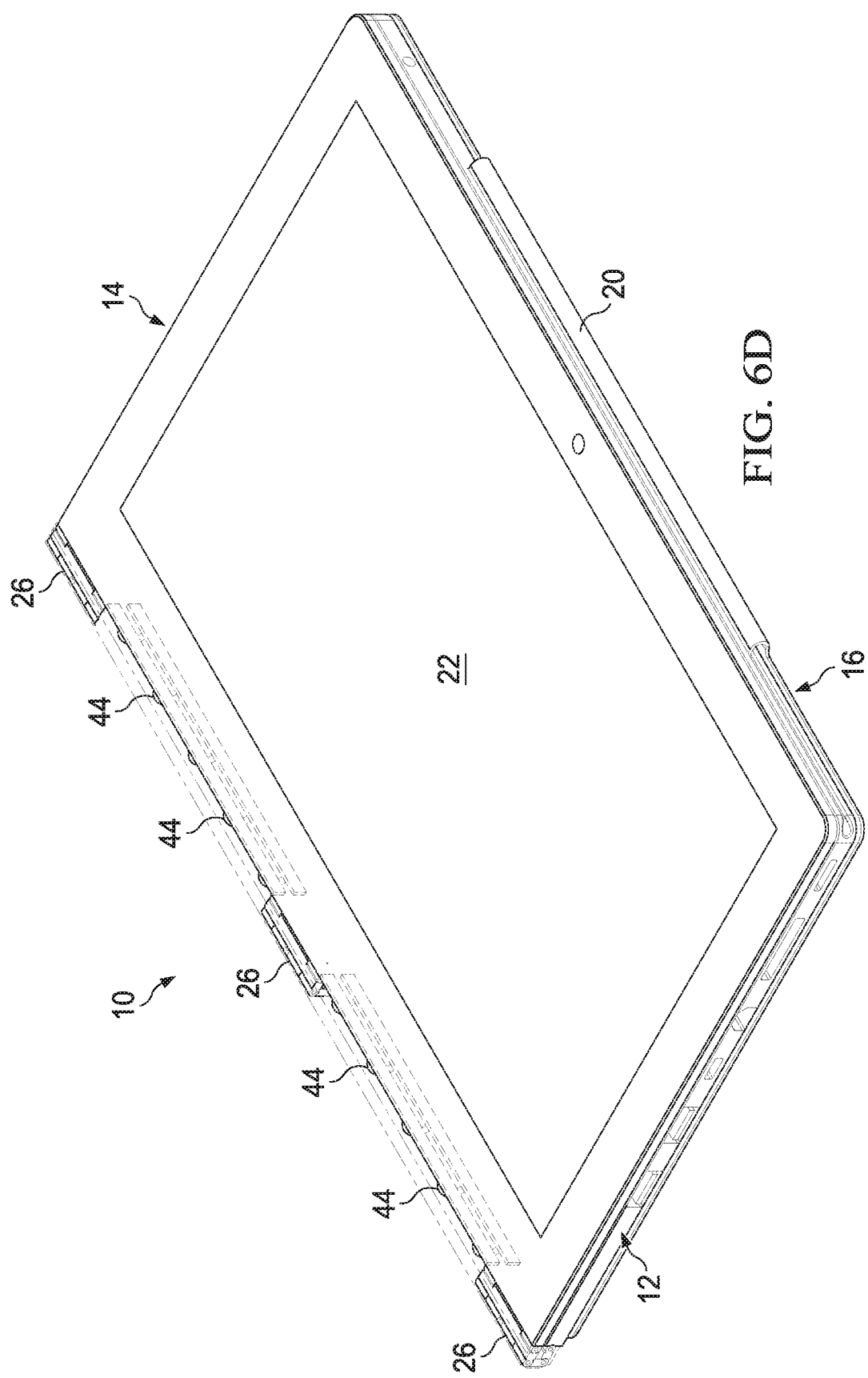
FIG. 6D is a simplified orthographic diagram illustrating an embodiment of an electronic device in a tablet configuration, in accordance with one embodiment of the present disclosure.

Turning to FIG. 6A, FIG. 6A is a simplified orthographic view illustrating an embodiment of electronic device 10 in an open clamshell configuration in accordance with one embodiment of the present disclosure. As illustrated in FIG. 6A, display hinge 38 can include a covering 42, a plurality of micro-hinges 26, and plurality of support rods 44. While only a portion of covering 42 is illustrated, covering 42 may cover the entire portion of display hinge 38 or display hinge 38 may not include any covering 42. Covering 42 can provide an aesthetic and/or a protective covering for plurality of micro-hinges 26 and plurality of support rods 44. Covering 42 may be a molded flexible polymer (e.g., polyurethane, or some other rubber like material) or some other material that provides an aesthetic and/or protective covering for plurality of micro-hinges 26 and plurality of support rods 44.

Turning to FIG. 6B, FIG. 6B is a simplified orthographic view of electronic device 10 in a flat configuration in accordance with one embodiment of the present disclosure. As illustrated, in FIG. 6B, display portion 14 has been rotated on plurality of micro-hinges 26 and plurality of support rods 44 such that display portion 14 is in the same plane as base portion 12. In addition, keyboard portion 16 has been rotated on keyboard hinge 20 such that keyboard portion 16 is also in the same plane as base portion 12. Plurality of micro-hinges 26, plurality of support rods 44, and keyboard hinge 20 are configured to lay relatively flat on a planer surface and allow electronic device 10 to have a low, flat, or relatively flat profile with a low z-height when electronic device 10 is in the flat configuration.

Turning to FIG. 6C, FIG. 6C is a simplified orthographic view illustrating an embodiment of electronic device 10 in a closed clamshell configuration in accordance with one embodiment of the present disclosure. As illustrated, in FIG. 6C, display portion 14 has been rotated on plurality of micro-hinges 26 and plurality of support rods 44 such that display portion 14 is facing base portion 12. In addition, keyboard portion 16 has been rotated on keyboard hinge 20 such that keyboard portion 16 is facing away from base portion 12. Plurality of micro-hinges 26, plurality of support rods 44, and keyboard hinge 30 are configured to have a low profile and allow electronic device 10 to have a low, flat, or relatively flat profile with a low z-height when electronic device 10 is in the closed clamshell configuration.

Turning to FIG. 6D, FIG. 6D is a simplified orthographic view of electronic device in a tablet configuration in accordance with one embodiment of the present disclosure. As illustrated in FIG. 6D, display portion 14 has been rotated on plurality of micro-hinges 26 and plurality of support rods 44 such that display 22 faces up and away from base portion 12. In addition, keyboard portion 16 has been rotated on keyboard hinge 20 such that keyboard 24 (not shown) faces down and away from base portion 12. In this configuration, base portion 12 is between display portion 14 and keyboard portion 16. Plurality of micro-hinges 26, plurality of support rods 44, and keyboard hinge 20 are configured to have a low profile and allow electronic device 10 to have a low, flat, or relatively flat profile with a low z-height when electronic device 10 is in the tablet configuration.

Figure 7A:
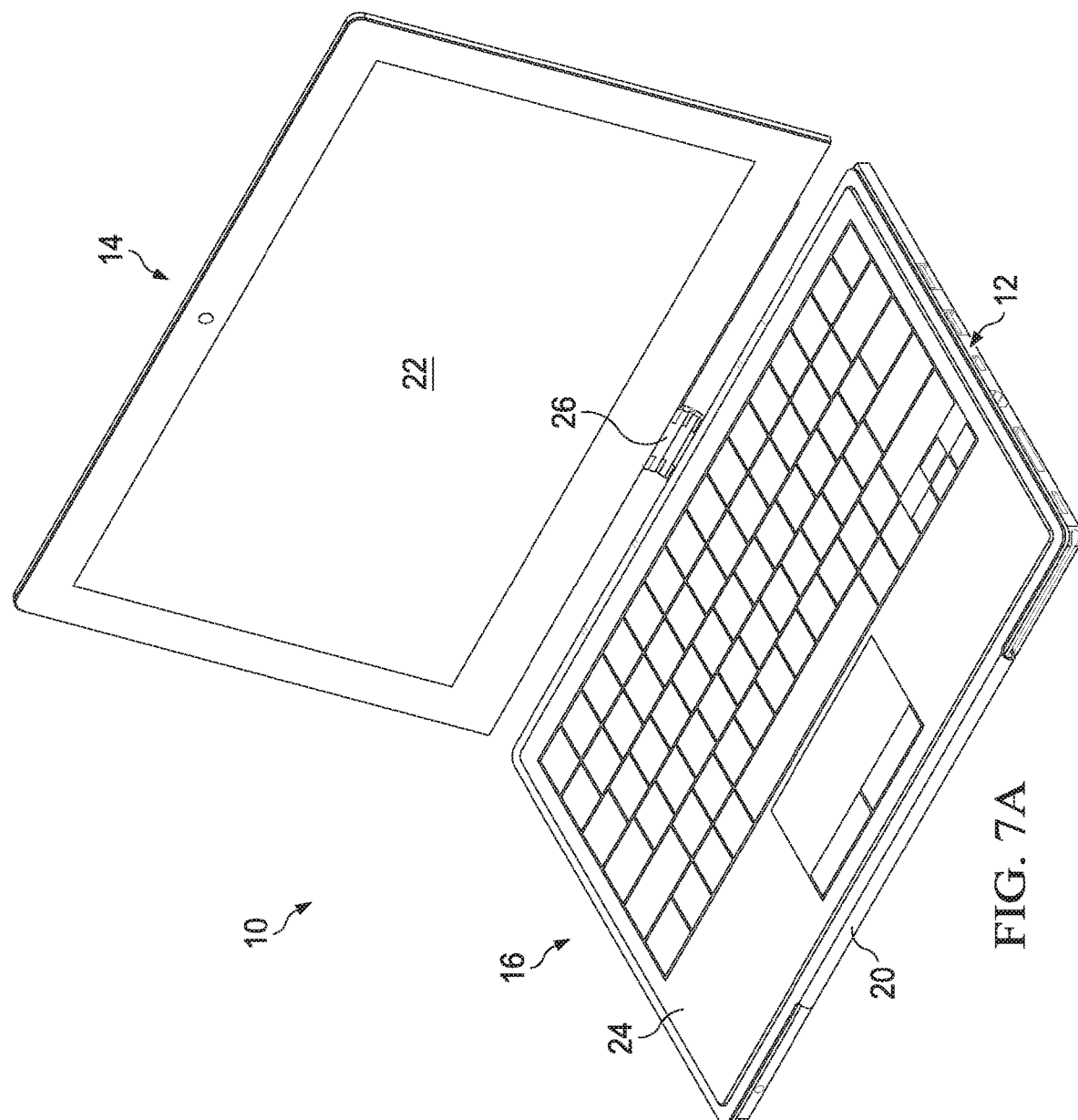
FIG. 7A is a simplified orthographic diagram illustrating an embodiment of an electronic device in an open clamshell configuration, in accordance with one embodiment of the present disclosure.

Turning to FIG. 7A, FIG. 7A is a simplified orthographic view illustrating an embodiment of electronic device 10 in an open clamshell configuration in accordance with one embodiment of the present disclosure. As illustrated in FIG. 7A, display portion 14 is supported by a single micro-hinge 26. The single micro-hinge 26 may include extra or more support than a single micro-hinge in plurality of micro-hinges 26. For example, the single micro-hinge 26 may include support rod 44. In an illustrative example, electrical conduit 40 may be configured to accommodate support rod 44 such that support rod 44 is contained in the single micro-hinge 26 and provides support to the single micro-hinge 26. The extra support can allow the single micro-hinge 26 to support display portion 14 in an open clamshell configuration.

Figure 7B:
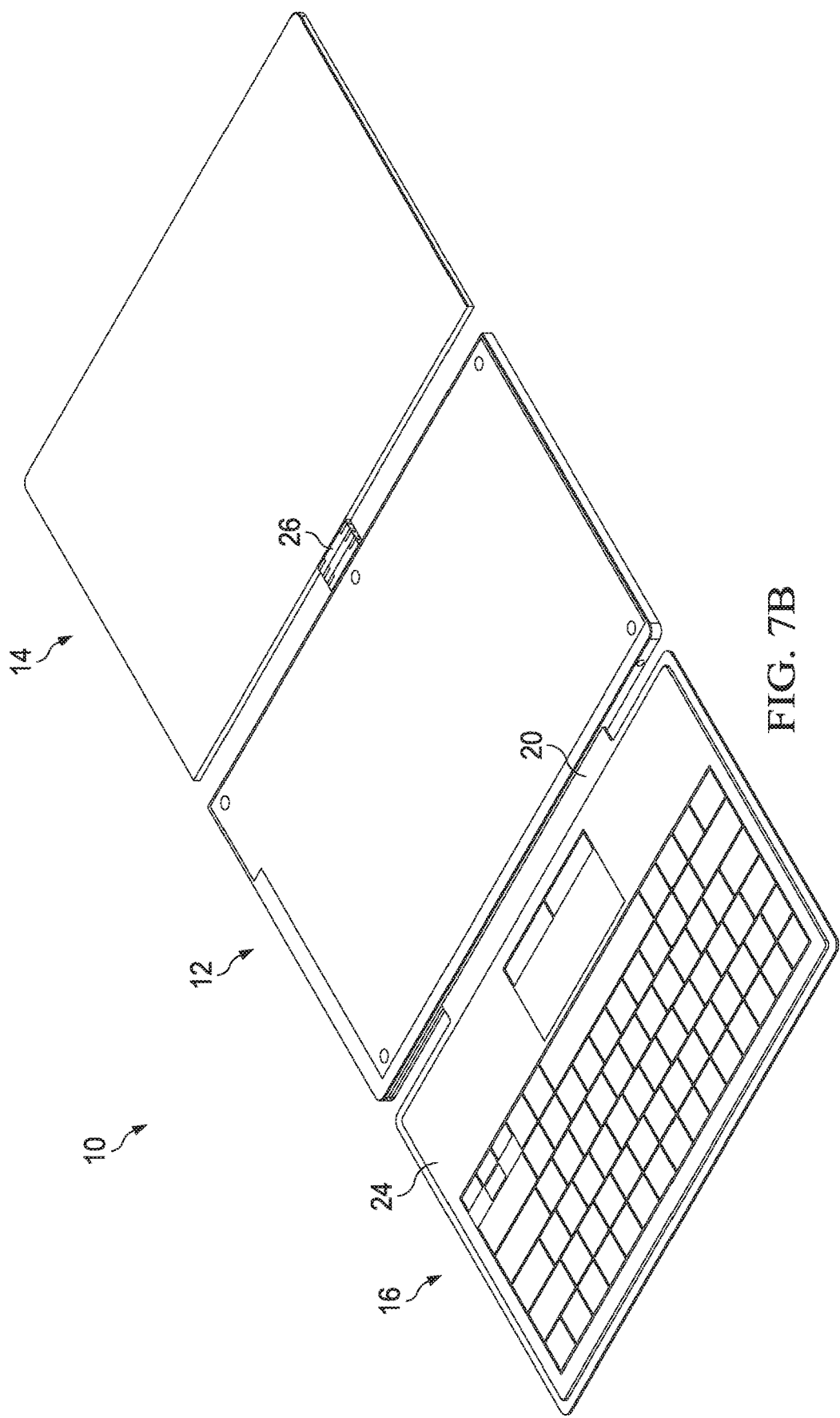
FIG. 7B is a simplified orthographic diagram illustrating an embodiment of an electronic device in an open flat configuration, in accordance with one embodiment of the present disclosure.

Turning to FIG. 7B, FIG. 7B is a simplified orthographic view of electronic device 10 in a flat configuration in accordance with one embodiment of the present disclosure. As illustrated, in FIG. 7B, display portion 14 has been rotated on the single micro-hinge 26 such that display portion 14 is in the same plane as base portion 12. In addition, keyboard portion 16 has been rotated on keyboard hinge 20 such that keyboard portion 16 is also in the same plane as base portion 12. The single micro-hinge 26 is configured to have a low profile and allow electronic device 10 to have a low, flat, or relatively flat profile with a low z-height when electronic device 10 is in the flat configuration.

Figure 7C:
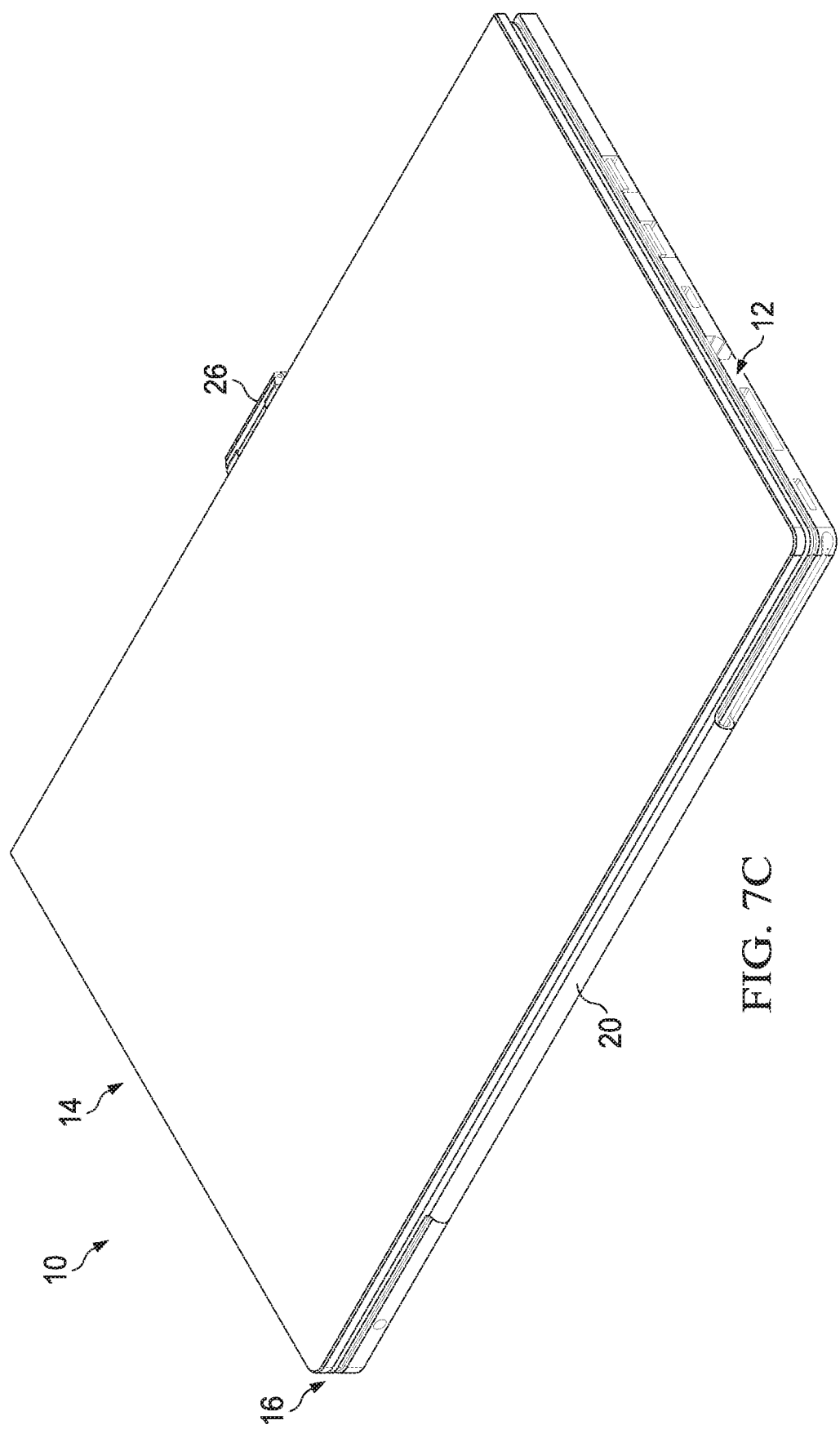
FIG. 7C is a simplified orthographic diagram illustrating an embodiment of an electronic device in a closed clamshell configuration, in accordance with one embodiment of the present disclosure.
Figure 7D:
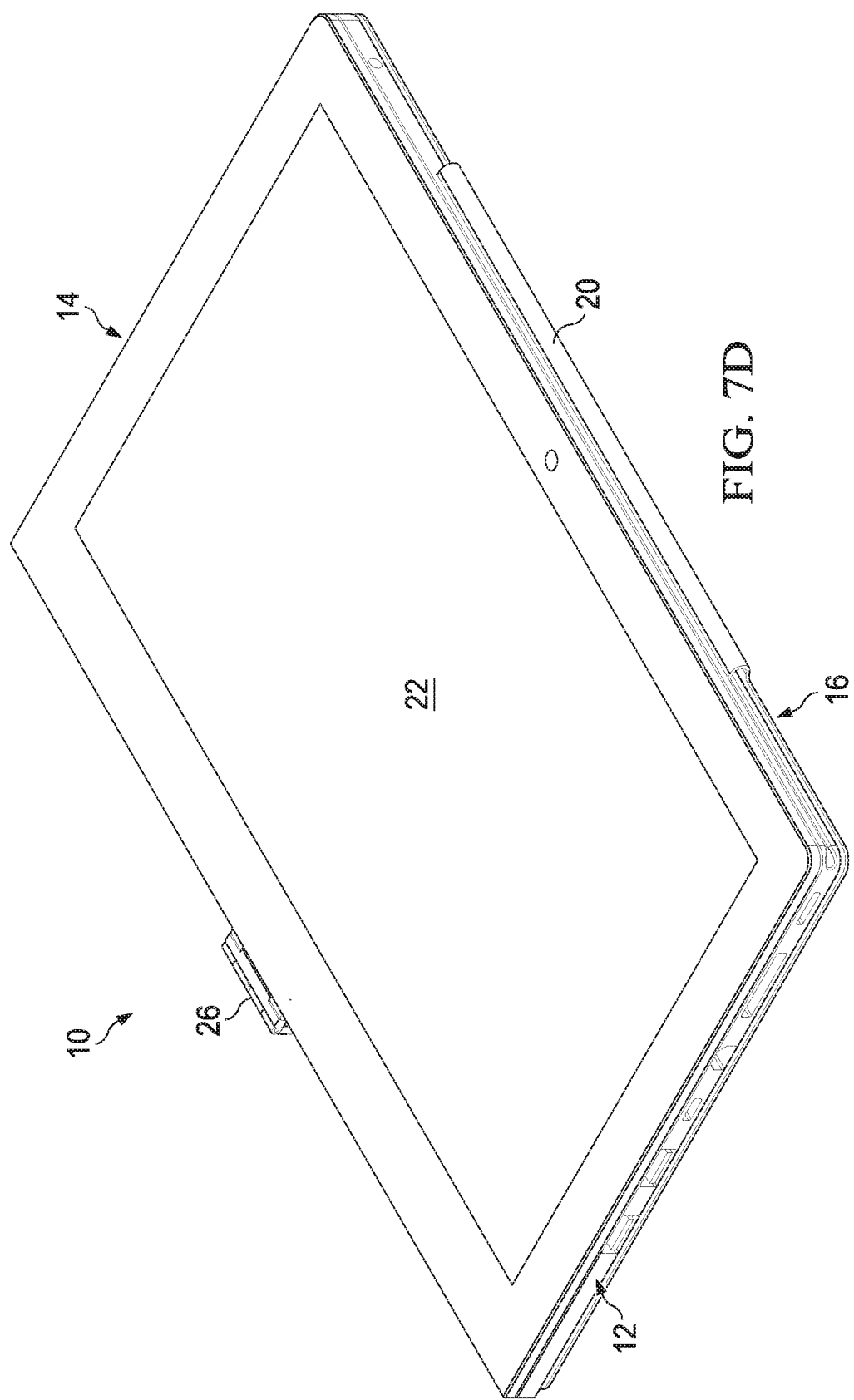
FIG. 7D is a simplified orthographic diagram illustrating an embodiment of an electronic device in a tablet configuration, in accordance with one embodiment of the present disclosure.
Figure 8A:
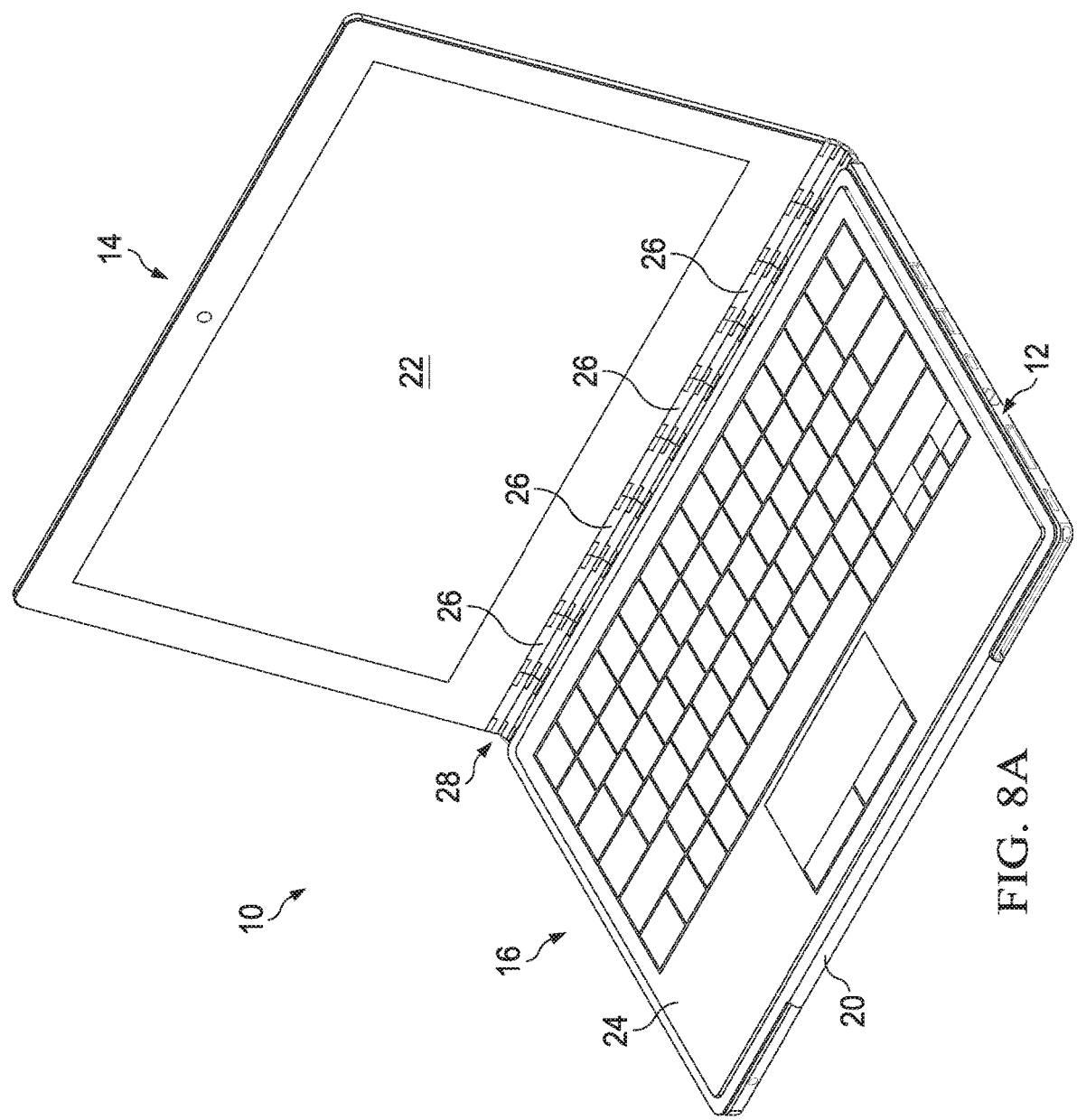
FIG. 8A is a simplified orthographic diagram illustrating an embodiment of an electronic device in an open clamshell configuration, in accordance with one embodiment of the present disclosure.

Turning to FIG. 7C, FIG. 7C is a simplified orthographic view illustrating an embodiment of electronic device 10 in a closed clamshell configuration in accordance with one embodiment of the present disclosure. As illustrated, in FIG. 7C, display portion 14 has been rotated on the single micro-hinge 26 such that display portion 14 is facing base portion 12. In addition, keyboard portion 16 has been rotated on keyboard hinge 20 such that keyboard portion 16 is facing away from base portion 12. The single micro-hinge 26 is configured to have a low profile and allow electronic device 10 to have a low, flat or relatively flat profile with a low z-height when electronic device 10 is in the closed clamshell configuration Turning to FIG. 7D, FIG. 7D is a simplified orthographic view of electronic device in a tablet configuration in accordance with one embodiment of the present disclosure. As illustrated in FIG. 7D, display portion 14 has been rotated on the single micro-hinge 26 such that display 22 faces up and away from base portion 12. In addition, keyboard portion 16 has been rotated on keyboard hinge 20 such that keyboard 24 (not shown) faces down and away from base portion 12. In this configuration, base portion 12 is between display portion 14 and keyboard portion 16. The single micro-hinge 26 is configured to have a low profile and allow electronic device 10 to have a low, flat or relatively flat profile with a low z-height when electronic device 10 is in the tablet configuration Turning to FIG. 8A, FIG. 8A is a simplified orthographic view illustrating an embodiment of electronic device 10 in an open clamshell configuration in accordance with one embodiment of the present disclosure. As illustrated in FIG. 8A, display portion 14 is supported by a micro-hinge band 28. Micro-hinge band 28 can include a continuous (or near continuous) band of micro-hinges 26. One or more of micro-hinges 26 in micro-hinge band 28 may include extra support. For example, one or more of micro-hinges 26 may include support rod 44 (e.g., electrical conduit 40 may be configured to accommodate support rod 44).

Figure 8B:
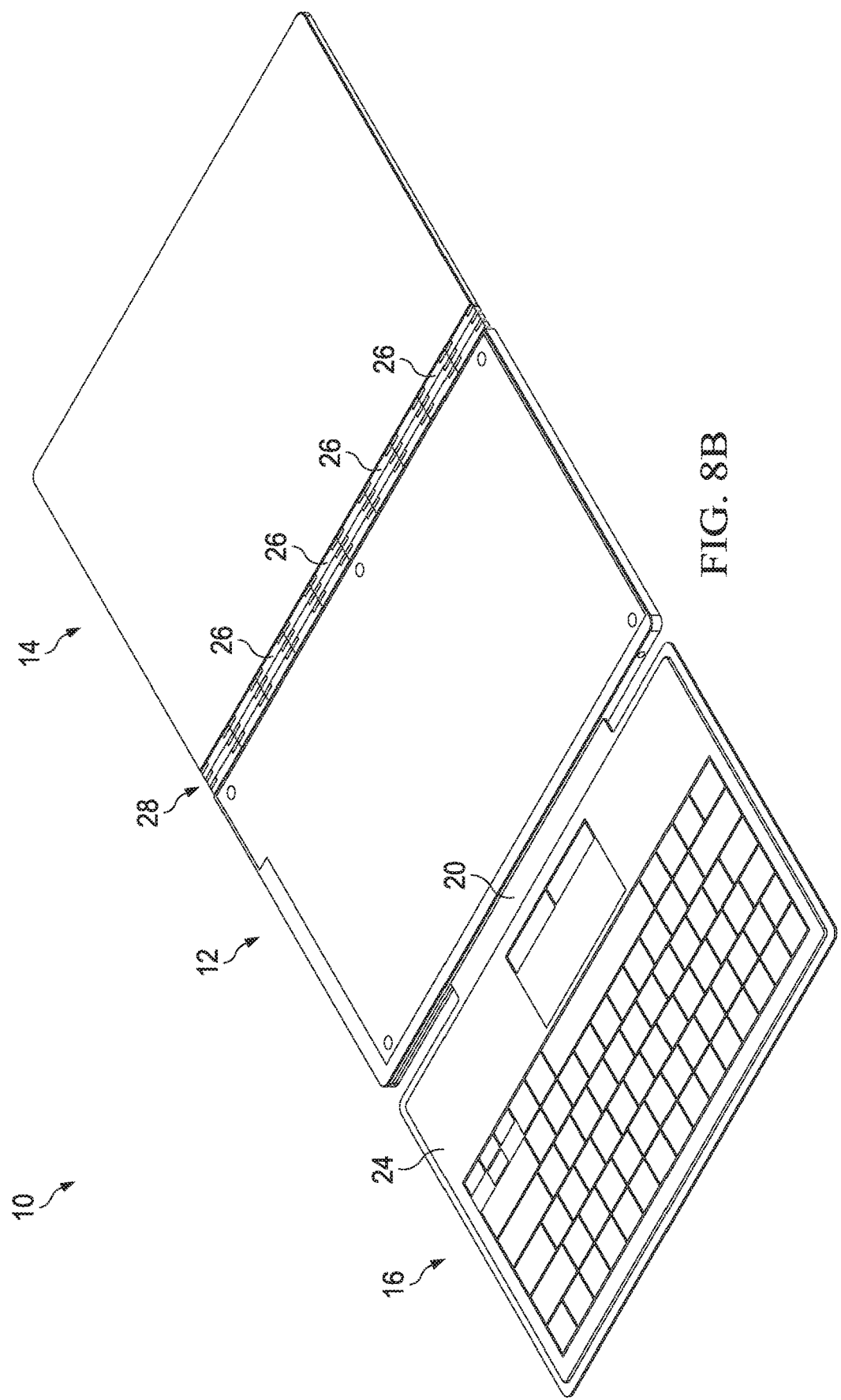
FIG. 8B is a simplified orthographic diagram illustrating an embodiment of an electronic device in an open flat configuration, in accordance with one embodiment of the present disclosure.

Turning to FIG. 8B, FIG. 8B is a simplified orthographic view of electronic device 10 in a flat configuration in accordance with one embodiment of the present disclosure. As illustrated, in FIG. 8B, display portion 14 has been rotated on micro-hinge band 28 such that display portion 14 is in the same plane as base portion 12. In addition, keyboard portion 16 has been rotated on keyboard hinge 20 such that keyboard portion 16 is also in the same plane as base portion 12. Micro-hinge band 28 is configured to have a low profile and allow electronic device 10 to have a low, flat, or relatively flat profile with a low z-height when electronic device 10 is in the flat configuration.

Figure 8C:
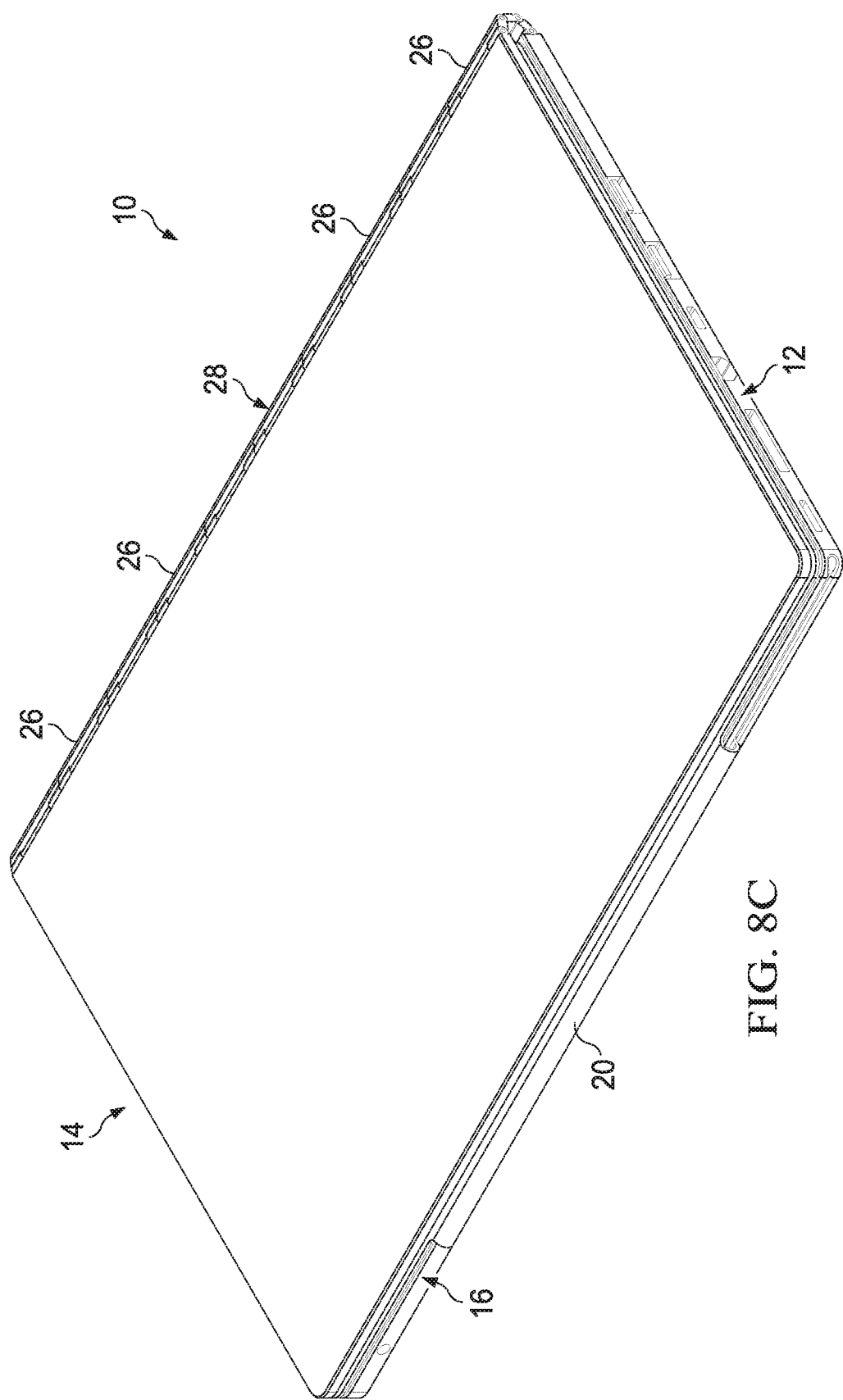
FIG. 8C is a simplified orthographic diagram illustrating an embodiment of an electronic device in a closed clamshell configuration, in accordance with one embodiment of the present disclosure.

Turning to FIG. 8C, FIG. 8C is a simplified orthographic view illustrating an embodiment of electronic device 10 in a closed clamshell configuration in accordance with one embodiment of the present disclosure. As illustrated, in FIG. 8C, display portion 14 has been rotated on micro-hinge band 28 such that display portion 14 is facing base portion 12. In addition, keyboard portion 16 has been rotated on keyboard hinge 20 such that keyboard portion 16 is facing away from base portion 12. Micro-hinge band 28 is configured to have a low profile and allow electronic device 10 to have a low, flat, or relatively flat profile with a low z-height when electronic device 10 is in the closed clamshell configuration.

Figure 8D:
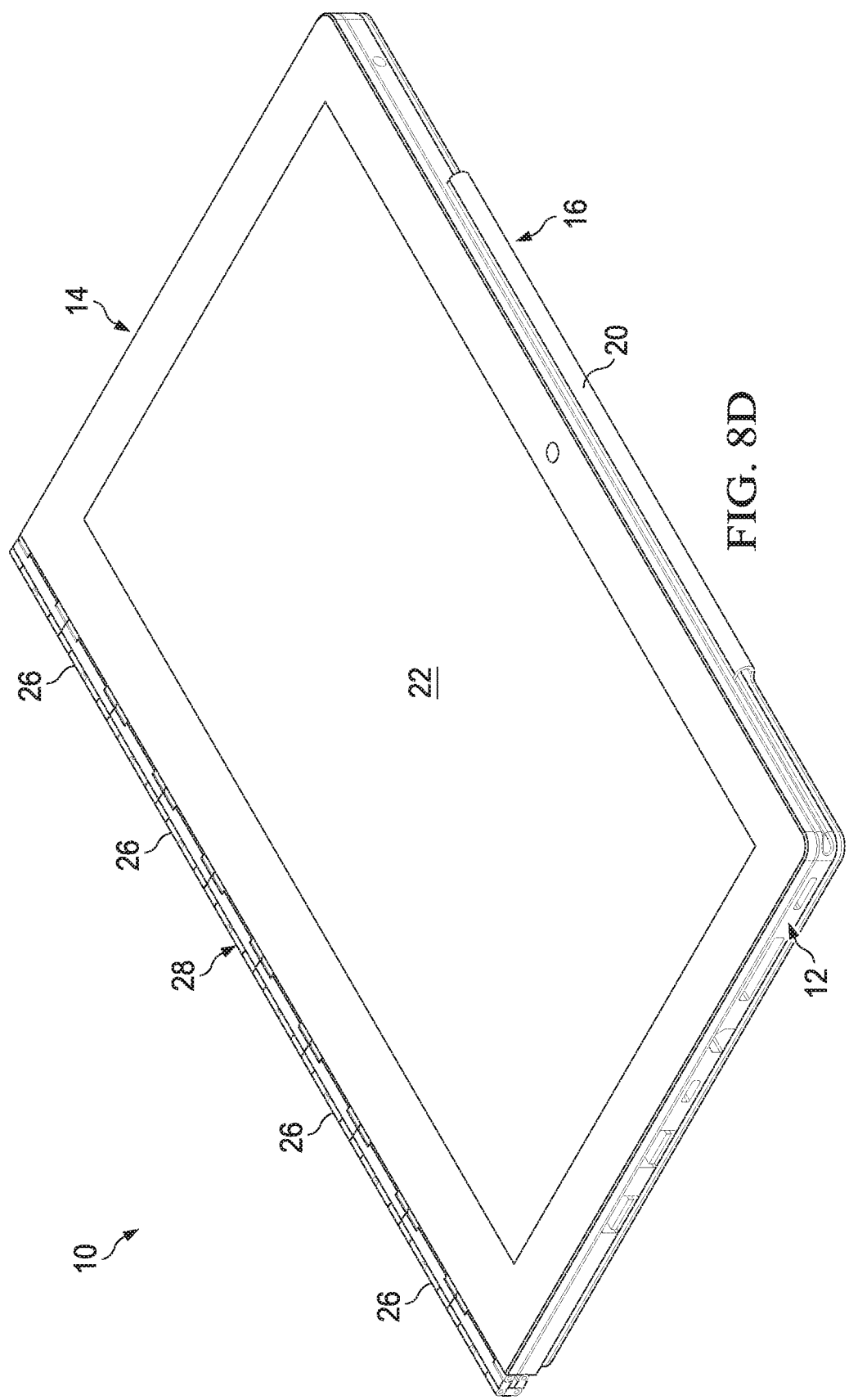
FIG. 8D is a simplified orthographic diagram illustrating an embodiment of an electronic device in a tablet configuration, in accordance with one embodiment of the present disclosure.

Turning to FIG. 8D, FIG. 8D is a simplified orthographic view of electronic device in a tablet configuration in accordance with one embodiment of the present disclosure. As illustrated in FIG. 8D, display portion 14 has been rotated on micro-hinge band 28 such that display 22 faces up and away from base portion 12. In addition, keyboard portion 16 has been rotated on keyboard hinge 20 such that keyboard 24 (not shown) faces down and away from base portion 12. In this configuration, base portion 12 is between display portion 14 and keyboard portion 16. Micro-hinge band 28 is configured to have a low profile and allow electronic device 10 to have a low, flat, or relatively flat profile with a low z-height when electronic device 10 is in the tablet configuration.

Figure 9:
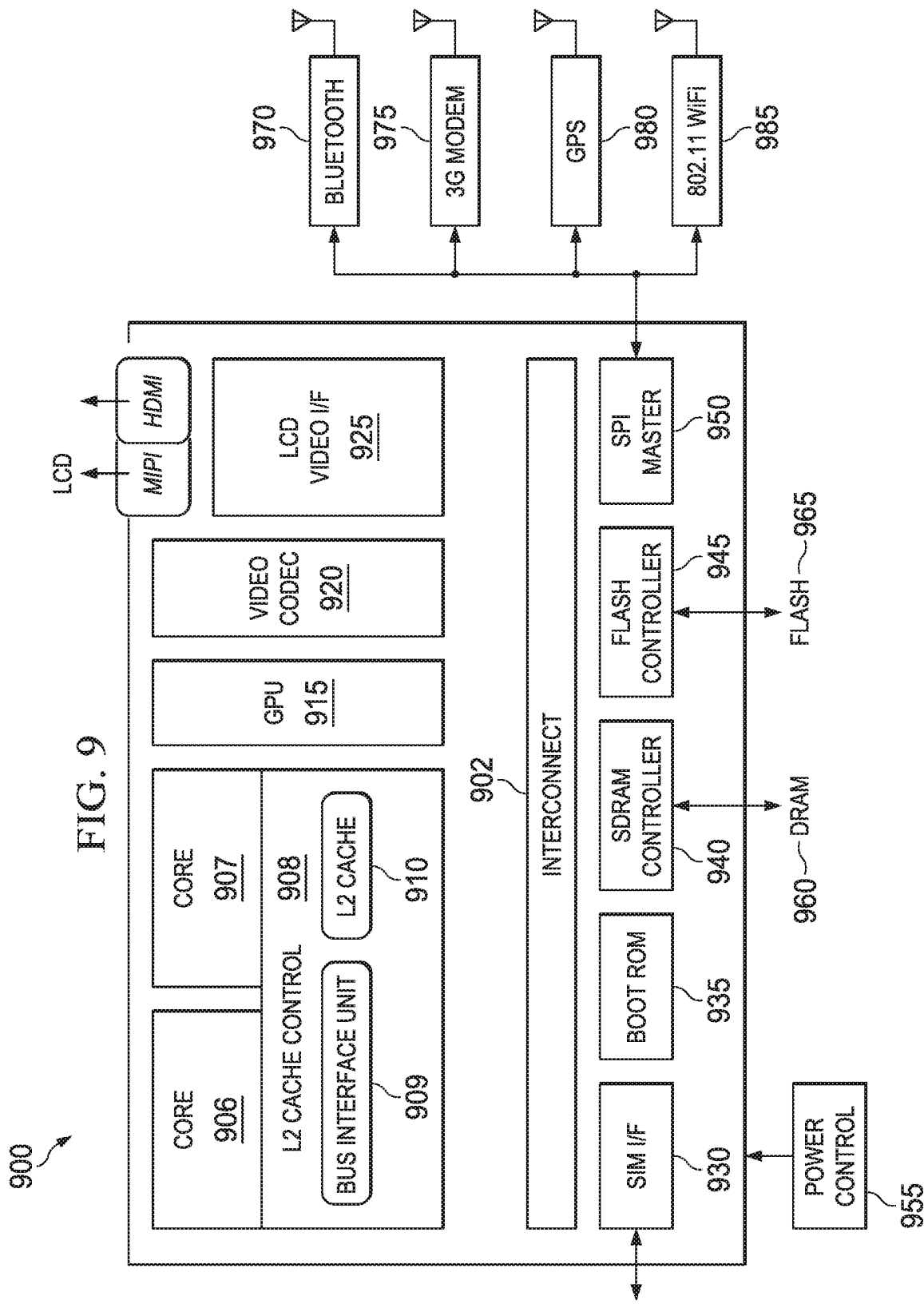
FIG. 9 is a simplified block diagram associated with an example ARM ecosystem system on chip (SOC) of the present disclosure.

Turning to FIG. 9, FIG. 9 is a simplified block diagram associated with an example ARM ecosystem SOC 900 of the present disclosure. At least one example implementation of the present disclosure can include the micro-hinge features discussed herein and an ARM component. For example, the example of FIG. 9 can be associated with any ARM core (e.g., A-9, A-15, etc.). Further, the architecture can be part of any type of tablet, smartphone (inclusive of Android™ phones, iPhones™), iPad™, Google Nexus™, Microsoft Surface™, personal computer, server, video processing components, laptop computer (inclusive of any type of notebook), Ultrabook™ system, any type of touch-enabled input device, etc.

In this example of FIG. 9, ARM ecosystem SOC 900 may include multiple cores 906-907, an L2 cache control 908, a bus interface unit 909, an L2 cache 910, a graphics processing unit (GPU) 915, an interconnect 902, a video codec 920, and a liquid crystal display (LCD) I/F 925, which may be associated with mobile industry processor interface (MIPI)/ high-definition multimedia interface (HDMI) links that couple to an LCD.

ARM ecosystem SOC 900 may also include a subscriber identity module (SIM) I/F 930, a boot read-only memory (ROM) 935, a synchronous dynamic random access memory (SDRAM) controller 940, a flash controller 945, a serial peripheral interface (SPI) master 950, a suitable power control 955, a dynamic RAM (DRAM) 960, and flash 965. In addition, one or more example embodiments include one or more communication capabilities, interfaces, and features such as instances of Bluetooth™ 970, a 3G modem 975, a global positioning system (GPS) 980, and an 802.11 Wi-Fi 985.

In operation, the example of FIG. 9 can offer processing capabilities, along with relatively low power consumption to enable computing of various types (e.g., mobile computing, high-end digital home, servers, wireless infrastructure, etc.). In addition, such an architecture can enable any number of software applications (e.g., Android™, Adobe® Flash® Player, Java Platform Standard Edition (Java SE), JavaFX, Linux, Microsoft Windows Embedded, Symbian and Ubuntu, etc.). In at least one example embodiment, the core processor may implement an out-of-order superscalar pipeline with a coupled low-latency level-2 cache.

Figure 10:
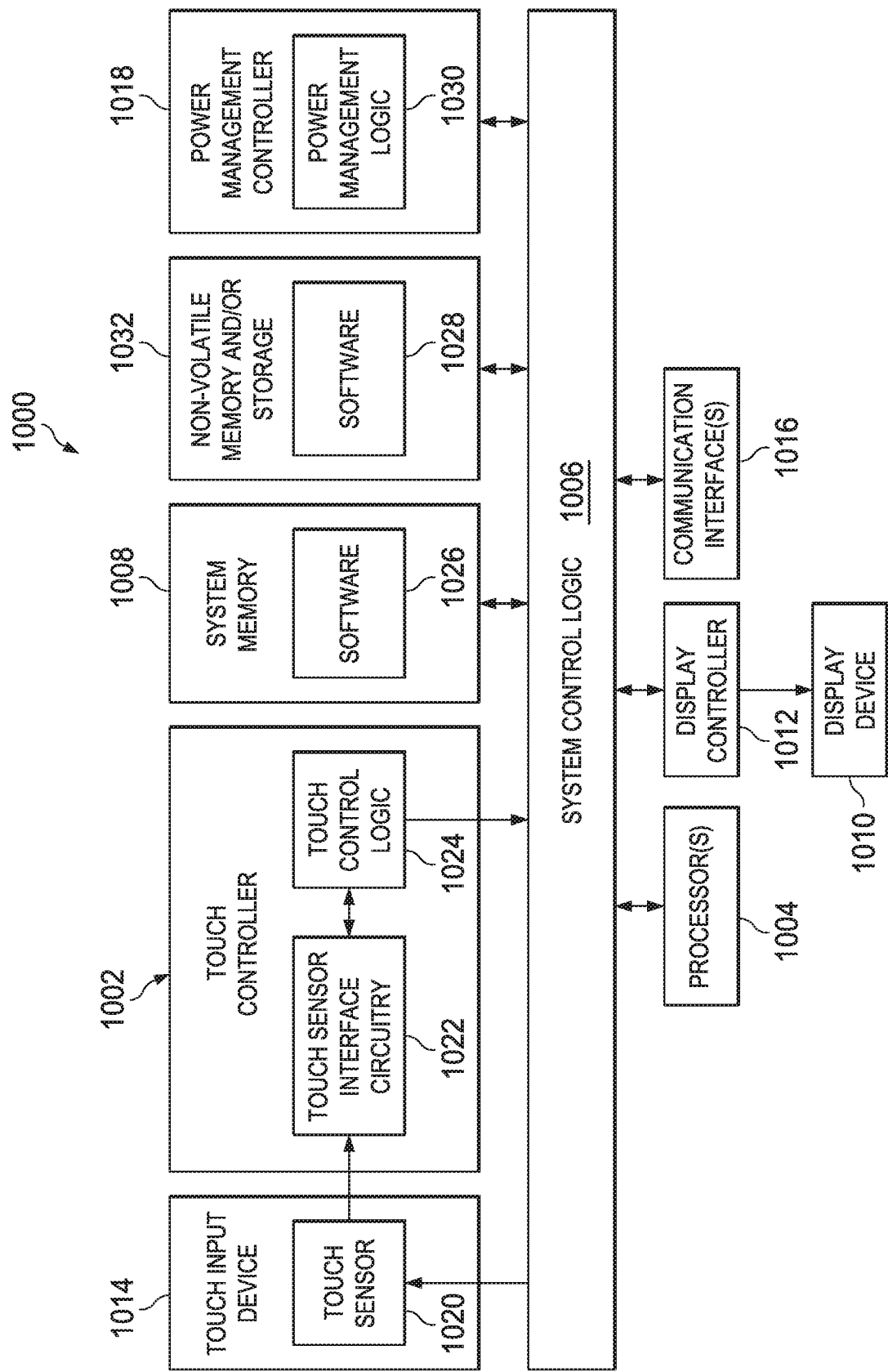
FIG. 10 is a simplified block diagram illustrating example logic that may be used to execute activities associated with the present disclosure.

Turning to FIG. 10, FIG. 10 is a simplified block diagram illustrating potential electronics and logic that may be associated with any of the electronic devices discussed herein. In at least one example embodiment, system 1000 can include a touch controller 1002, one or more processors 1004, system control logic 1006 coupled to at least one of processor(s) 1004, system memory 1008 coupled to system control logic 1006, non-volatile memory and/or storage device(s) 1032 coupled to system control logic 1006, display controller 1012 coupled to system control logic 1006, display controller 1012 coupled to a display device 1010, power management controller 1018 coupled to system control logic 1006, and/or communication interfaces 1016 coupled to system control logic 1006.

System control logic 1006, in at least one embodiment, can include any suitable interface controllers to provide for any suitable interface to at least one processor 1004 and/or to any suitable device or component in communication with system control logic 1006. System control logic 1006 in at least one example embodiment, can include one or more memory controllers to provide an interface to system memory 1008. System memory 1008 may be used to load and store data and/or instructions, for example, for system 1000. System memory 1008, in at least one example embodiment, can include any suitable volatile memory, such as suitable dynamic random access memory (DRAM) for example. System control logic 1006, in at least one example embodiment, can include one or more I/O controllers to provide an interface to display device 1010, touch controller 1002, and non-volatile memory and/or storage device(s) 1032.

Non-volatile memory and/or storage device(s) 1032 may be used to store data and/or instructions for example within software 1028. Non-volatile memory and/or storage device(s) 1032 may include any suitable non-volatile memory, such as flash memory for example, and/or may include any suitable non-volatile storage device(s), such as one or more hard disc drives (HDDs), one or more compact disc (CD) drives, and/or one or more digital versatile disc (DVD) drives for example.

Power management controller 1018 may include power management logic 1030 configured to control various power management and/or power saving functions disclosed herein or any part thereof. In at least one example embodiment, power management controller 1018 is configured to reduce the power consumption of components or devices of system 1000 that may either be operated at reduced power or turned off when the electronic device is in a closed configuration. For example, in at least one example embodiment when the electronic device is in a closed configuration, power management controller 1018 performs one or more of the following: power down the unused portion of the display and/or any backlight associated therewith; allow one or more of processor(s) 1004 to go to a lower power state if less computing power is required in the closed configuration; and shutdown any devices and/or components that are unused when an electronic device is in the closed configuration.

Communications interface(s) 1016 may provide an interface for system 1000 to communicate over one or more networks and/or with any other suitable device. Communications interface(s) 1016 may include any suitable hardware and/or firmware. Communications interface(s) 1016, in at least one example embodiment, may include, for example, a network adapter, a wireless network adapter, a telephone modem and/or a wireless modem.

System control logic 1006, in at least one example embodiment, can include one or more I/O controllers to provide an interface to any suitable input/output device(s) such as, for example, an audio device to help convert sound into corresponding digital signals and/or to help convert digital signals into corresponding sound, a camera, a camcorder, a printer, and/or a scanner.

For at least one example embodiment, at least one processor 1004 may be packaged together with logic for one or more controllers of system control logic 1006. In at least one example embodiment at least one processor 1004 may be packaged together with logic for one or more controllers of system control logic 1006 to form a System in Package (SiP). In at least one example embodiment, at least one processor 1004 may be integrated on the same die with logic for one or more controllers of system control logic 1006. For at least one example embodiment, at least one processor 1004 may be integrated on the same die with logic for one or more controllers of system control logic 1006 to form a System on Chip (SoC).

For touch control, touch controller 1002 may include touch sensor interface circuitry 1022 and touch control logic 1024. Touch sensor interface circuitry 1022 may be coupled to detect touch input over a first touch surface layer and a second touch surface layer of a display (i.e., display device 1010). Touch sensor interface circuitry 1022 may include any suitable circuitry that may depend for example, at least in part on the touch-sensitive technology used for a touch input device. Touch sensor interface circuitry 1022, in one embodiment, may support any suitable multi-touch technology. Touch sensor interface circuitry 1022, in at least one embodiment, can include any suitable circuitry to convert analog signals corresponding to a first touch surface layer and a second surface layer into any suitable digital touch input data. Suitable digital touch input data for at least one embodiment may include, for example, touch location or coordinate data.

Touch control logic 1024 may be coupled to help control touch sensor interface circuitry 1022 in any suitable manner to detect touch input over a first touch surface layer and a second touch surface layer. Touch control logic 1024 for at least one example embodiment may also be coupled to output in any suitable manner digital touch input data corresponding to touch input detected by touch sensor interface circuitry 1022. Touch control logic 1024 may be implemented using any suitable logic, including any suitable hardware, firmware, and/or software logic (e.g., non-transitory tangible media), that may depend, for example, at least in part on the circuitry used for touch sensor interface circuitry 1022. Touch control logic 1024 for at least one embodiment may support any suitable multi-touch technology.

Touch control logic 1024 may be coupled to output digital touch input data to system control logic 1006 and/or at least one processor 1004 for processing. At least one processor 1004 for at least one embodiment may execute any suitable software to process digital touch input data output from touch control logic 1024. Suitable software may include, for example, any suitable driver software and/or any suitable application software. As illustrated in FIG. 10, system memory 1008 may store suitable software 1026 and/or non-volatile memory and/or storage device(s).

Note that in some example implementations, the functions outlined herein may be implemented in conjunction with logic that is encoded in one or more tangible, non-transitory media (e.g., embedded logic provided in an application-specific integrated circuit (ASIC), in digital signal processor (DSP) instructions, software [potentially inclusive of object code and source code] to be executed by a processor, or other similar machine, etc.). In some of these instances, memory elements can store data used for the operations described herein. This can include the memory elements being able to store software, logic code, or processor instructions that are executed to carry out the activities described herein. A processor can execute any type of instructions associated with the data to achieve the operations detailed herein. In one example, the processors could transform an element or an article (e.g., data) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., a field programmable gate array (FPGA), a DSP, an erasable programmable read only memory (EPROM), electrically erasable programmable read-only memory (EEPROM)) or an ASIC that can include digital logic, software, code, electronic instructions, or any suitable combination thereof.

It is imperative to note that all of the specifications, dimensions, and relationships outlined herein (e.g., height, width, length, materials, etc.) have only been offered for purposes of example and teaching only. Each of these data may be varied considerably without departing from the spirit of the present disclosure, or the scope of the appended claims. The specifications apply only to one non-limiting example and, accordingly, they should be construed as such. In the foregoing description, example embodiments have been described. Various modifications and changes may be made to such embodiments without departing from the scope of the appended claims. The description and drawings are, accordingly, to be regarded in an illustrative rather than a restrictive sense.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

Example Embodiment Implementations

One particular example implementation of an electronic device may include activities associated with a low profile-hinge design. The low profile hinge design allows for a hybrid or convertible laptop hinge that does not have bulky hinge components that can create a large profile, inhibit the functionality and usability of an electronic device, and have significant industrial design implications. The low profile hinge can be configured with a micro-hinge that couples a first element to a second element. The micro-hinge can includes a first attachment that couples to the first element a second attachment that couples to the second element, and a plurality of linkages that couples the first attachment to the second attachment. The first element may be a base portion and the second element may be a display portion. The micro-hinge can rotate about three hundred and sixty degrees and may have a flexible covering. The low profile hinge may further include a plurality of micro-hinges and a plurality of support rods. In an example, the low profile hinge extends about the length of the first element and the second element. In addition, the micro-hinge may further include an electrical conduit.

OTHER NOTES AND EXAMPLES

Example A1 is a low profile hinge that includes a micro-hinge. The micro-hinge can couple a first element to a second element and includes a first attachment that couples to the first element, a second attachment that couples to the second element, and a plurality of linkages that couples the first attachment to the second attachment.

In Example A2, the subject matter of Example A1 may optionally include where the low profile hinge can rotate about three hundred and sixty degrees.

In Example A3, the subject matter of any of the preceding 'A' Examples can optionally include a plurality of micro-hinges and a plurality of support rods.

In Example A4, the subject matter of any of the preceding 'A' Examples can optionally include a flexible covering.

In Example A5, the subject matter of any of the preceding 'A' Examples can optionally include where the low profile hinge extends about the length of the first element and the second element.

In Example A6, the subject matter of any of the preceding 'A' Examples can optionally include where the micro-hinge further includes an electrical conduit.

In Example A7, the subject matter of any of the preceding 'A' Examples can optionally include where the first element is a base portion of an electronic device.

In Example A8, the subject matter of any of the preceding 'A' Examples can optionally include where the second element is a display portion of an electronic device.

Example AA1 can include an electronic device that includes a base portion, a display portion, and a micro-hinge that couples the base portion to the display portion. The micro-hinge can include a first attachment that couples to the base portion, a second attachment that couples to the display portion, and a plurality of linkages that couples the first attachment to the second attachment.

In Example AA2, the subject matter of any of the preceding 'AA' Examples can optionally include where the micro-hinge can rotate about three hundred and sixty degrees.

In Example AA3, the subject matter of any of the preceding 'AA' Examples can optionally include a plurality of micro-hinges and a plurality of support rods.

In Example AA4, the subject matter of any of the preceding 'AA' Examples can optionally include where the micro-hinge further includes a flexible covering.

In Example AA5, the subject matter of any of the preceding 'AA' Examples can optionally include where the micro-hinge extends about the length of the base portion and the display portion.

In Example AA6, the subject matter of any of the preceding 'AA' Examples can optionally include where the micro-hinge further includes an electrical conduit.

In Example AA7, the subject matter of any of the preceding 'AA' Examples can optionally include where the micro-hinge is a low profile hinge.

Example M1 is a method that includes rotating a display portion around a base portion using a low profile micro-hinge, where the low profile micro-hinge includes a first attachment that couples to the base portion, a second attachment that couples to the display portion, and a plurality of linkages that couples the first attachment to the second attachment.

In Example M2, the subject matter of any of the preceding 'M' Examples can optionally include where a plurality of low-profile micro-hinges and a plurality of support rods are used to rotate the display portion around the base portion.

In Example M3, the subject matter of any of the preceding 'M' Examples can optionally include where the low profile micro-hinge further includes a flexible covering.

In Example M4, the subject matter of any of the preceding 'M' Examples can optionally include where the low profile micro-hinge further includes an electrical conduit.

An example system S1 can include means for rotating a display portion around a base portion using a low profile micro-hinge, where the low profile micro-hinge includes a first attachment that couples to the base portion, a second attachment that couples to the display portion, and a plurality of linkages that couples the first attachment to the second attachment.

An example system SS1 can include a processor and a micro-hinge that couples a first element to a second element, where the micro-hinge includes a first attachment that couples to the first element, a second attachment that couples to the second element, and a plurality of linkages that couples the first attachment to the second attachment.

In Example SS2, the subject matter of any of the preceding 'SS' Examples can optionally include where the micro-hinge can rotate three hundred and sixty degrees.

In Example SS3, the subject matter of any of the preceding 'SS' Examples can optionally include a plurality of micro-hinges and a plurality of support rods.

In Example SS4, the subject matter of any of the preceding 'SS' Examples can optionally include where the micro-hinge further includes an electrical conduit.

In Example SS5, the subject matter of any of the preceding 'SS' Examples can optionally include where the first element is a base portion and the second element is a display portion.

Example X1 is a machine-readable storage medium including machine-readable instructions to implement a method or realize an apparatus as in any one of the Examples A1-A8, AA1-AA7, M1-M4. Example Y1 is an apparatus comprising means for performing of any of the Example methods M1-M4. In Example Y2, the subject matter of Example Y1 can optionally include the means for performing the method comprising a processor and a memory. In Example Y3, the subject matter of Example Y2 can optionally include the memory comprising machine-readable instructions.

What is claimed is:

1. An electronic device comprising:
   a base carrying a keyboard;
   a display; and
   a hinge to secure the display to the base, the hinge including a base linkage near the base, a display linkage near the display, and at least one intermediate linkage between the base linkage and the display linkage,
   the base linkage, the at least one intermediate linkage, and the display linkage to rotate in a first direction to enable the display to move into a closed configuration in which the display faces the keyboard,
   the base linkage, the at least one intermediate linkage, and the display linkage to rotate in a second direction to enable the display to move away from the base into an open configuration,
   the linkages to form an arch between the base linkage and the display linkage when the display is in the closed configuration,
   at least two of the base linkage, the at least one intermediate linkage, and the display linkage to move from a curved position to a flat position when the display moves from the closed configuration toward the open configuration, the at least two of the base linkage, the at least one intermediate linkage, and the display linkage lying in a plane when the at least two of the base linkage, the at least one intermediate linkage, and the display linkage are in the flat position.

2. The electronic device as defined in claim 1, wherein the hinge is to enable the display to rest with a screen of the display facing away from the base.

3. The electronic device as defined in claim 2, wherein the linkages are to form the arch between the base linkage and the display linkage when the screen of the display is facing away from the base.

4. The electronic device as defined in claim 1, further including a covering to cover the linkages, the covering to extend along a length of the base.

5. The electronic device as defined in claim 1, wherein the base linkage is to interlock with one of the at least one intermediate linkages.

6. The electronic device as defined in claim 5, wherein the at least one intermediate linkage includes a first intermediate linkage and a second intermediate linkage, the first intermediate linkage to interlock with the base linkage and the second intermediate linkage to interlock with the display linkage.

7. The electronic device as defined in claim 1, further including a rod extending through an opening defined in the at least one intermediate linkage.

8. The electronic device as defined in claim 1, wherein the at least one intermediate linkage is stacked between the base linkage and the display linkage.

9. The electronic device as defined in claim 1, wherein the hinge is to support the display in an at least partially upright position when the display is in the open configuration.

10. The electronic device as defined in claim 1, wherein the arch defines an opening therein.

11. An electronic device comprising:
a keyboard;
a base to support the keyboard;
a display; and
means for securing the display to the base, the means for securing to enable the display to move from a first position in which the display faces the keyboard to a second position in which the display faces away from the keyboard, the means for securing having a curved profile relative to the base when the display is in the first position, at least a portion of the means for securing having a flat profile relative to the base when the display is in the second position.

12. The electronic device as defined in claim 11, wherein the means for securing includes at least three linkages.

13. The electronic device as defined in claim 12, further including means for coupling two of the at least three linkages.

14. The electronic device as defined in claim 11, wherein a first linkage is to engage the base, a second linkage is to engage the display, and a third linkage is between the first linkage and the second linkage.

15. The electronic device as defined in claim 11, further including a covering to cover the means for securing.

16. The electronic device as defined in claim 11, wherein the means for securing is to support the display in at least a partially upright position when the display is in the second position.

17. An electronic device comprising:
a base;
a keyboard on the base;
a display including a display screen; and
a hinge including at least three hinge segments to link the base to the display, the hinge segments to rotate in a first direction to enable the display to move into a closed configuration in which the display faces the keyboard, the hinge segments to rotate in a second direction to enable the display to move away from the base into an open configuration, the hinge segments in an arch when the display is in the closed configuration, at least two of the hinge segments to move from a curved position to a flat position when the display moves from the closed configuration toward the open configuration, the at least two hinge segments lying in a plane when the at least two hinge segments are in the flat position.

18. The electronic device as defined in claim 17, wherein the hinge segments define an opening of the arch.

19. The electronic device as defined in claim 17, further including a covering to cover the hinge segments.

20. The electronic device as defined in claim 17, wherein a first one of the hinge segments defines an opening and further including a rod extending through the opening.

* * * * *